United States Patent
Maleki et al.

(10) Patent No.: US 8,681,827 B2
(45) Date of Patent: Mar. 25, 2014

(54) GENERATION OF SINGLE OPTICAL TONE, RF OSCILLATION SIGNAL AND OPTICAL COMB IN A TRIPLE-OSCILLATOR DEVICE BASED ON NONLINEAR OPTICAL RESONATOR

(75) Inventors: Lute Maleki, Pasadena, CA (US); Andrey B. Matsko, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 93 days.

(21) Appl. No.: 13/472,420

(22) Filed: May 15, 2012

(65) Prior Publication Data

US 2012/0294319 A1   Nov. 22, 2012

Related U.S. Application Data

(60) Provisional application No. 61/486,695, filed on May 16, 2011.

(51) Int. Cl.
*H01S 3/10* (2006.01)

(52) U.S. Cl.
USPC .......................................................... 372/21

(58) Field of Classification Search
USPC ............................................. 372/21; 331/66
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A * | 3/1998 | Yao et al. | 250/227.11 |
| 5,751,747 A | 5/1998 | Lutes et al. | |
| 5,777,778 A * | 7/1998 | Yao | 359/245 |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Yao et al. | |
| 6,490,039 B2 | 12/2002 | Maleki et al. | |
| 6,535,328 B2 | 3/2003 | Yao | |

(Continued)

FOREIGN PATENT DOCUMENTS

WO   01/96936 A1   12/2001
WO   2005/038513 A2   4/2005

(Continued)

OTHER PUBLICATIONS

Braginsky, V.B., et al., "Quality-Factor and Nonlinear Properties of Optical Whispering-Gallery Modes," Physics Letters A, 137(7, 8):393-397, May 1989.

(Continued)

*Primary Examiner* — Jessica Stultz
*Assistant Examiner* — Tuan Nguyen
(74) *Attorney, Agent, or Firm* — Perkins Coie LLP

(57) ABSTRACT

Techniques and devices based on optical resonators made of nonlinear optical materials to form triple-oscillator devices for generating a single optical tone, a radio frequency (RF) oscillation signal and an optical frequency comb signal having different optical frequencies.

28 Claims, 14 Drawing Sheets

(56) References Cited

U.S. PATENT DOCUMENTS

| | | | |
|---|---|---|---|
| 6,567,436 B1 * | 5/2003 | Yao et al. ..................... 372/32 |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,801,189 B2 | 9/2010 | Maleki et al. |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 7,991,025 B2 | 8/2011 | Maleki et al. |
| 8,089,684 B1 | 1/2012 | Koonath et al. |
| 8,094,359 B1 | 1/2012 | Matsko et al. |
| 8,102,597 B1 | 1/2012 | Maleki et al. |
| 8,111,722 B1 | 2/2012 | Maleki et al. |
| 8,155,913 B2 | 4/2012 | Eliyahu et al. |
| 8,155,914 B2 | 4/2012 | Eliyahu et al. |
| 8,159,736 B2 | 4/2012 | Maleki et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2005/0286602 A1 | 12/2005 | Gunn et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |
| 2010/0118375 A1 | 5/2010 | Maleki et al. |
| 2011/0069723 A1 | 3/2011 | Dong et al. |
| 2011/0110387 A1 | 5/2011 | Maleki et al. |
| 2011/0150485 A1 | 6/2011 | Seidel et al. |
| 2011/0255094 A1 | 10/2011 | Mohageg et al. |
| 2012/0039346 A1 | 2/2012 | Liang et al. |

FOREIGN PATENT DOCUMENTS

| | | |
|---|---|---|
| WO | 2005/055412 A2 | 6/2005 |
| WO | 2005/067690 A2 | 7/2005 |
| WO | 2005/122346 A2 | 12/2005 |
| WO | 2006/076585 A2 | 7/2006 |
| WO | 2007/143627 A2 | 12/2007 |

OTHER PUBLICATIONS

Eliyahu, D., et al., "Low Phase Noise and Spurious Levels in Multi-Loop Opto-Electronic Oscillators," Proceedings of the 2003 IEEE International Frequency Control Sympsoium and PDA Exhibition, pp. 405-410, May 2003.

Eliyahu, D., et al., "Modulation Response (S21) of the Coupled Opto-Electronic Oscillator," Proceedings of the 2005 IEEE International Frequency Control Symposium and Exposition, pp. 850-856, Aug. 2005.

Eliyahu, D., et al., "Tunable, Ultra-Low Phase Noise YIG Based Opto-Electronic Oscillator," IEEE MTT-S International Microwave Symposium Digest, 3:2185-2187, Jun. 2003.

Gorodetsky, M.L., et al., "Optical Microsphere Resonators: Optimal Coupling to High-Q Whispering-Gallery Modes," J. Opt. Soc. Am. B, 16(1):147-154, Jan. 1999.

Gorodetsky, M.L., et al., "Rayleigh Scattering in High-Q Microspheres," J. Opt. Soc. Am. B, 17(6):1051-1057, Jun. 2000.

Gorodetsky, M.L., et al., "Ultimate Q of Optical Microsphere Resonators," Optics Letters, 21(7):453-455, Apr. 1996.

Hryniewicz, J.V., et al., "Higher Order Filter Response in Coupled Microring Resonators," IEEE Photonics Technology Letters, 12(3):320-322, Mar. 2000.

Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.

Ilchenko, V., et al., "Electrooptically Tunable Photonic Microresonators and Photonic Bandgap Waveguide Coupling for Micro-Optoelectronic Oscillators," GOMACTech 2003, Tampa, Florida, pp. 1-4.

Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.

Ilchenko, V., et al., "Microsphere Integration in Active and Passive Photonics Devices," Proc. of SPIE Laser Resonators III, vol. 3930, pp. 154-162, Jan. 2000.

Ilchenko, V., et al., "Microtorus: A High-Finesse Microcavity with Whispering-Gallery Modes," Optics Letters, 26(5):256-258, Mar. 2001.

Ilchenko, V., et al., "Pigtailing the High-Q Microsphere Cavity: A Simple Fiber Coupler for Optical Whispering-Gallery Modes," Optics Letters, 24(11):723-725, Jun. 1999.

Ilchenko, V., et al., "Sub-Micro Watt Photonic Microwave Receiver," IEEE Photonics Technology Letters, 14(11):1602-1604, Nov. 2002.

Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.

(56) References Cited

OTHER PUBLICATIONS

Ilchenko, V., et al., "Whispering-Gallery-Mode Electro-Optic Modulator and Photonic Microwave Receiver," J. Opt. Soc. Am. B, 20(2):333-342, Feb. 2003.

Ito, H., et al., "InP/InGaAs Uni-Travelling-Carrier Photodiode with 310 GHz Bandwidth," Electronics Letters, 36 (21):1809-1810, Oct. 2000.

Logan, R., et al., "Stabilization of Oscillator Phase Using a Fiber-Optic Delay-Line," IEEE 45th Annual Symposium on Frequency Control, pp. 508-512, May 1991.

Maleki, L., "The Opto-Electronic Oscillator: Prospects for Extending the State of the Art in Reference Frequency Generation," International Topical Meeting on Microwave Photonics, pp. 195-198, Oct. 1998.

Matsko, A., et al., "Active Mode Locking with Whispering-Gallery Modes," J. Opt. Soc. Am. B, 20(11):2292-2296, Nov. 2003.

Matsko, A., et al., "Whispering-Gallery-Mode based Optoelectronic Microwave Oscillator," Journal of Modern Optics, 50(15-17):2523-2542, Feb. 2004.

Matsko, A., et al., "Whispering-Gallery-Mode Resonators as Frequency References. I. Fundamental Limitations," J. Opt. Soc. Am. B, 24(6):1324-1335, Jun. 2007.

Myers, L.E., et al., "Quasi-Phase-Matched Optical Parametric Oscillators in Bulk Periodically Poled LiNbO3," J. Opt. Soc. Am. B, 12(11):2102-2116, Nov. 1995.

Savchenkov, A., et al., "RF photonic signal processing components: From high order tunable filters to high stability tunable oscillators," IEEE Radar Conference, pp. 1-6, May 2009.

Savchenkov, A., et al., "Tunable Resonant Single-Sideband Electro-Optical Modulator," Digest of the IEEE/LEOS Summer Topical Meetings, pp. 63-64, Jul. 2009.

Savchenkov, A., et al., "Whispering-Gallery-Mode Resonators as Frequency References. II. Stabilization," J. Opt. Soc. Am. B, 24(12):2988-2997, Dec. 2007.

Vassiliev, V.V., et al., "Narrow-Line-Width Diode Laser with a High-Q Microsphere Resonator," Optics Communications, 158(1-6):305-312, Dec. 1998.

Yao, X.S., et al., "A Novel Photonic Oscillator," Digest of the LEOS Summer Topical Meetings, pp. 17-18, Aug. 1995.

Yao, X.S., et al., "A Novel Photonic Oscillator," TDA Progress Report 42-122, pp. 32-43, Aug. 1995.

Yao, X.S., et al., "Converting Light into Spectrally Pure Microwave Oscillation," Optics Letters, 21(7):483-485, Apr. 1996.

Yao, X.S., et al., "Coupled Optoelectronic Oscillators for Generating Both RF Signal and Optical Pulses," Journal of Lightwave Technology, 18(1):73-78, Jan. 2000.

Yao, X.S., et al., "Dual Microwave and Optical Oscillator," Optics Letters, 22(24):1867-1869, Dec. 1997.

Yao, X.S., et al., "Multiloop Optoelectronic Oscillator," IEEE Journal of Quantum Electronics, 36(1):79-84, Jan. 2000.

Yao, X.S., et al., "Optoelectronic Microwave Oscillator," J. Opt. Soc. Am. B, 13(8):1725-1735, Aug. 1996.

Yao, X.S., et al., "Optoelectronic Oscillator for Photonic Systems," IEEE Journal of Quantum Electronics, 32(7):1141-1149, Jul. 1996.

Yu, J., et al., "Compact Optoelectronic Oscillator with Ultra-Low Phase Noise Performance," Electronics Letters, 35(18):1554-1555, Sep. 1999.

\* cited by examiner

US 8,681,827 B2

GENERATION OF SINGLE OPTICAL TONE, RF OSCILLATION SIGNAL AND OPTICAL COMB IN A TRIPLE-OSCILLATOR DEVICE BASED ON NONLINEAR OPTICAL RESONATOR

CROSS-REFERENCES TO RELATED APPLICATIONS

This patent document claims the benefit of U.S. Provisional Application No. 61/486,695 entitled "TRIPLE-OSCILLATOR: GENERATION OF A SPECTRALLY PURE RF SIGNAL, OPTICAL FREQUENCY COMB, AND NARROW-LINEWIDTH LIGHT FROM A SINGLE DEVICE" and filed May 16, 2011, the disclosure of which is incorporated by reference as part of the specification of this document.

BACKGROUND

This application relates to signal oscillators based on photonic devices.

RF and microwave oscillators for generating signals in the RF and microwave frequencies may be constructed as "hybrid" devices by using both electronic and optical components to form opto-electronic oscillators ("OEOs"). See, e.g., U.S. Pat. Nos. 5,723,856, 5,777,778, 5,929,430, and 6,567,436. Such an OEO includes an electrically controllable optical modulator and at least one active opto-electronic feedback loop that includes an optical part and an electrical part interconnected by a photodetector. The opto-electronic feedback loop receives the modulated optical output from the modulator and converted the modulated optical output into an electrical signal which is applied to control the modulator. The feedback loop produces a desired long delay in the optical part of the loop to suppress phase noise and feeds the converted electrical signal in phase to the modulator to generate the optical modulation and generate and sustain an electrical oscillation in RF or microwave frequencies when the total loop gain of the active opto-electronic loop and any other additional feedback loops exceeds the total loss. The generated oscillating signals are tunable in frequency and can have narrow spectral linewidths and low phase noise in comparison with the signals produced by other RF and microwaves oscillators.

SUMMARY

This document provides techniques and devices based on optical resonators made of nonlinear optical materials to generate a single frequency optical tone, an RF or microwave oscillation signal and an optical comb signal having different optical frequencies in a single device.

In one aspect, this document provides a triple-oscillator device for generating a single optical tone, a radio frequency (RF) oscillation signal and an optical comb signal having different optical frequencies. This device includes an optical resonator formed of a nonlinear optical material exhibiting a third order optical nonlinearity; a continuous wave (CW) laser to produce a laser beam at a laser carrier frequency that interacts with the nonlinear optical material of the resonator to generate an optical frequency comb having different optical frequencies including the laser carrier frequency inside the resonator; an optical coupler that couples the laser beam into the resonator and light inside the resonator out of the resonator as a self-injection feedback beam towards the laser; an optical filter located between the laser and the resonator to filter the self-injection feedback beam directed from the optical evanescent coupler to the laser to direct light at the laser carrier frequency into the laser to cause injection locking of the laser to the resonator at the laser carrier frequency while blocking other spectral components in the self-injection feedback beam from entering the laser; a first beam splitter placed between the laser and the optical filter to transmit a portion of the beam between the laser and the optical filter and to direct another portion of the beam as a first device output which is a single optical tone at the laser carrier frequency; a photodiode located to receive an output optical beam coupled out of the resonator carrying the optical frequency comb to produce an RF oscillation signal as a second device output; and a second beam splitter located in an optical path of the output optical beam received by the photodiode to transmit a portion of output optical beam to the photodiode for generating the RF oscillation signal and to direct another portion of the beam as a third device output which is a replica of the optical frequency comb generated inside the resonator.

In another aspect, a triple-oscillator device is provided to include an optical resonator formed of a nonlinear optical material exhibiting a third order optical nonlinearity; and a reflective amplifier that reflects light and amplifies light from the resonator to direct reflected light towards the resonator to interact with the nonlinear optical material of the resonator to generate an optical frequency comb having different optical frequencies inside the resonator. The reflective amplifier provides an optical gain to sustain laser oscillation between the reflective amplifier and the resonator at a laser carrier frequency. This device further includes an optical coupler that couples the light from the reflective amplifier into the resonator and light inside the resonator out of the resonator as a feedback beam towards the reflective amplifier and further couples light from the reflective amplifier into the resonator; an optical filter located between the reflective amplifier and the resonator to filter the feedback beam directed from the optical coupler to the reflective amplifier to direct light at the laser carrier frequency within the feedback beam into the reflective amplifier to cause amplification of the light at the laser carrier frequency; a first beam splitter placed between the reflective amplifier and the optical filter to transmit a portion of the beam between the reflective amplifier and the optical filter and to direct another portion of the beam as a first device output which is a single optical tone at the laser carrier frequency; a photodiode located to receive an output optical beam coupled out of the resonator carrying the optical frequency comb to produce an RF oscillation signal as a second device output; and a second beam splitter located in an optical path of the output optical beam received by the photodiode to transmit a portion of output optical beam to the photodiode for generating the RF oscillation signal and to direct another portion of the beam as a third device output which is a replica of the optical frequency comb generated inside the resonator.

These and other aspects and implementations are described in detail in the drawings, the description and the claims.

DETAILED DESCRIPTION

Figure 1:
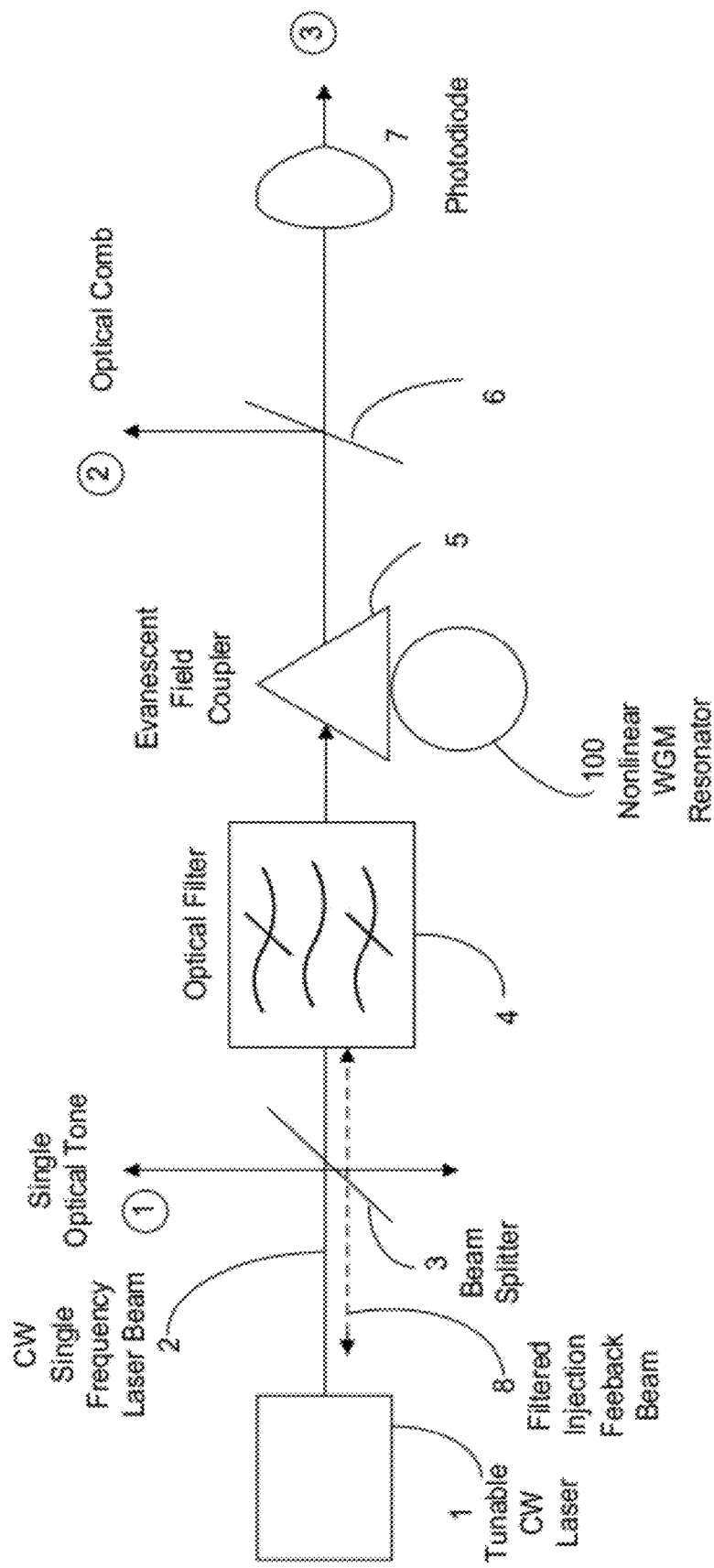
FIG. 1 shows one example of a triple-oscillator device that generates a single frequency optical tone, an RF or microwave oscillation signal and an optical comb signal having different optical frequencies in a single device.

This application describes implementations of a high frequency photonic microwave oscillator (e.g., in the X-W bands) based on the nonlinear process of four wave mixing (FWM) in crystalline whispering gallery mode resonators such as calcium fluoride or another material possessing cubic optical nonlinearity) that can be packaged in small packages. In FWM, the large field intensity in the high finesse WGM transforms two pump photons into two sideband photons, i.e., a signal photo and an idler photon. The sum of frequencies of the generated photons is equal to twice the frequency of the pumping light because of the energy conservation law. By supersaturating the oscillator and using multiple optical harmonics escaping the resonator (optical comb) the described oscillators can reduce the phase noise and increase spectral purity of the microwave signals generated on a fast photodiode.

In the examples provided in this document, a monolithic optical resonator possessing a cubic nonlinearity and pumped externally with continuous wave light can be used in a triple-oscillator device to generate three frequency-stable signals: (i) a single frequency optical tone, (ii) a phase locked/mode locked (optical pulses) multiple frequency optical tones, and (iii) spectrally pure radio frequency (RF) signal. Using a single device to generate all of the signals can be advantageous in various applications and, as a specific example, such a triple oscillator device can be packaged in a single, chip-scale, architecture.

The triple oscillator devices described in this document are photonic oscillators capable of generating a narrow linewidth laser beam at a laser carrier frequency, multiple mode-locked optical tones in form of an optical come, and a spectrally pure RF or microwave signal. In some implementations, the triple oscillator is based on a high-Q monolithic optical resonator and a continuous wave (CW) laser (such as a semiconductor laser) locked to the resonator via self-injection or other type of locking. In the case of self-injection locking it is possible to use an optical amplifier that starts lasing due to resonant feedback from the resonator. The resonator material features optical nonlinearity of third order, so the effects of cross- and self-phase modulation of the optical signal can occur in the resonator.

Locking of a laser to a resonator results in significant reduction of the laser linewidth so that generation of sub-kHz optical signals becomes possible. A nonlinear resonator pumped with a CW laser beam can generate an optical frequency comb. The optical frequency comb at some conditions can be used to generate spectrally pure and frequency stable RF signals by demodulating the optical frequency comb on a fast photodiode. The designs provided in this document integrates generation of the monochromatic light, optical frequency comb, and the RF signal in a single device. The phase of light entering and interacting with the resonator can be adjusted to obtain each of the three signals in the corresponding optical or RF output. Phase adjustment can be implemented by, for example, including a semiconductor phase section, inserting an adjustable delay, or changing the optical length of the segment between the laser and the resonator thermally, or otherwise by application of a voltage and/or current to change the index. Examples of possible realization of the setups are provided in this document. Several evanescent field optical couplers and a single resonator can be used to reduce noise of the generated signals. In implementations, the evanescent field couplers can be realized using prisms, tapered fibers, or planar dielectric waveguides. A notable feature of the designs is generation of the three signals in a single heterogeneous chip with optical and electronic elements.

FIG. 1 shows one example of a triple oscillator device for generating a single optical tone, a radio frequency (RF) oscillation signal and an optical comb signal having different optical frequencies. This device includes an optical resonator 100 formed of a nonlinear optical material exhibiting a third order optical nonlinearity; a continuous wave (CW) laser 1 to produce a CW laser beam 2 at a single frequency (laser carrier frequency). This beam 2 is introduced into the resonator 100 and interacts with the nonlinear optical material of the resonator 100 to generate an optical comb having different optical frequencies including the laser carrier frequency inside the resonator 100. An optical coupler 5 is provided to couple to the resonator 100 to couple the laser beam into the resonator 100 and to couple light inside the resonator 100 out of the resonator 100 as an injection feedback beam towards the laser 1. This optical coupler can be implemented in various optical coupling configurations, including but not limited to, for example, evanescent optical couplers that couple light based optical evanescent fields at optical interfaces in some implementations. An optical filter 4 is located between the laser 1 and the resonator 100 to filter the injection feedback beam directed from the optical evanescent coupler 5 to the laser 1 to direct light at the laser carrier frequency within the injection feedback beam into the laser 1 to cause injection locking of the laser 1 to the resonator 100 at the laser carrier frequency. The optical filter 4 is a bandpass filter that blocks other spectral components in the self-injection feedback beam from entering the laser 1. In this example, a first beam splitter 3 is placed between the laser 1 and the optical filter 4 to transmit a portion of the beam between the laser 1 and the optical filter 4 and to direct another portion of the beam as a first device output which is a single optical tone at the laser carrier frequency. An optical detector 7, e.g., a fast photodiode, is located to receive an output optical beam coupled out of the resonator 100 carrying the optical comb to produce an RF oscillation signal as a second device output. A second beam splitter 6 is located in an optical path of the output optical beam received by the photodiode 7 to transmit a portion of output optical beam to the photodiode 7 for generating the RF oscillation signal and to direct another portion of the beam as a third device output which is a replica of the optical comb generated inside the resonator 100.

The optical filter 4 is provided to select a single optical tone in the optical comb while rejecting other optical tones in the optical comb. This selected optical tone can be the light at the laser carrier frequency at which the laser 1 operates. In some designs, if the laser 1 has an optical resonator with a high cavity Q factor with a narrow linewidth so that two different optical tones in the optical comb generated via the nonlinear optical interaction within the nonlinear resonator 100 cannot be present at the same time, the optical filter 4 may be eliminated.

The optical resonator 100 in FIG. 1 and other triple oscillator devices described in this document can be implemented in various resonator configurations. The corresponding optical coupler 5 or additional optical coupler in FIG. 18 can be configured in coupler configurations suitable for the specific implementations of the optical resonator 100. Optical whispering-gallery-mode resonators are examples for the optical resonator 100 and can be used to exploit the various technical features of the whispering-gallery-mode resonators to meet various requirements of specific applications. In other implementations, the triple oscillator devices described here can be implemented using other optical resonators different from whispering-gallery-mode resonators.

The following sections turn to specific details of the construction of the nonlinear WGM resonator 100 and its operation based on the nonlinearity to produce the desired optical comb.

The optical resonators may be configured as optical whispering-gallery-mode ("WGM") resonators which support a special set of resonator modes known as whispering gallery ("WG") modes. These WG modes represent optical fields confined in an interior region close to the surface of the resonator due to the total internal reflection at the boundary. For example, a dielectric sphere may be used to form a WGM resonator where WGM modes represent optical fields confined in an interior region close to the surface of the sphere around its equator due to the total internal reflection at the sphere boundary. Quartz microspheres with diameters on the order of $10\sim10^2$ microns have been used to form compact optical resonators with Q values greater than $10^9$. Such hi-Q WGM resonators may be used to produce oscillation signals with high spectral purity and low noise. Optical energy, once coupled into a whispering gallery mode, can circulate at or near the sphere equator over a long photon life time.

WGM resonators made of crystals described in this application can be optically superior to WGM resonators made of fused silica. WGM resonators made of crystalline $CaF_2$ can produce a Q factor at or greater than $10^{10}$. Such a high Q value allows for various applications, including generation of kilohertz optical resonances and low-threshold optical hyperparametric oscillations due to the Kerr nonlinear effect. The following sections first describe the exemplary geometries for crystal WGM resonators and then describe the properties of WGM resonators made of different materials.

Figure 2A:
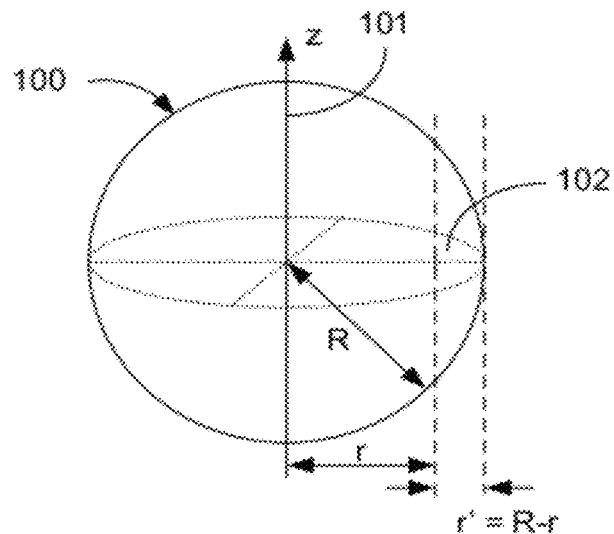
FIGS. 2A, 2B, 3, 4A, 4B, 5A and 5B show examples of WGM resonators and optical coupling designs.
Figure 2B:
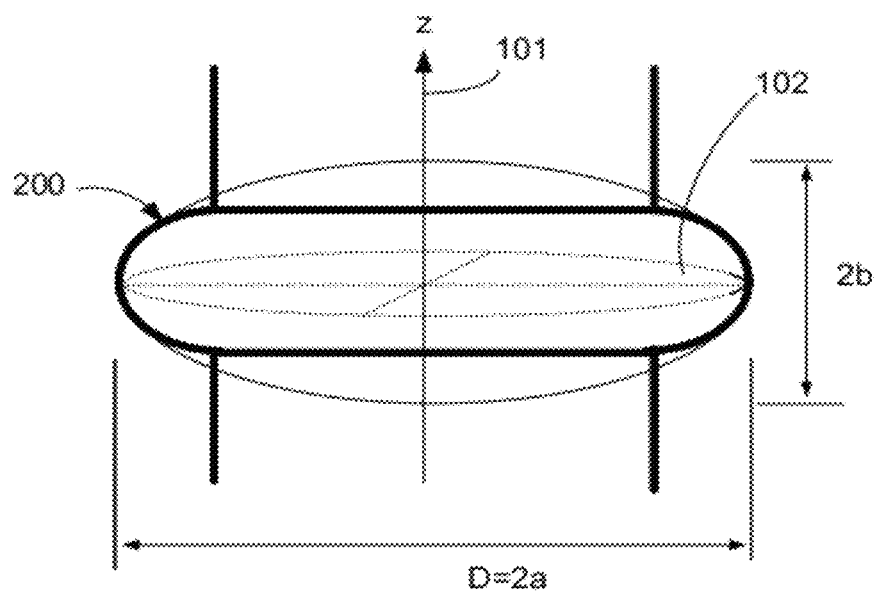
Figure 3:
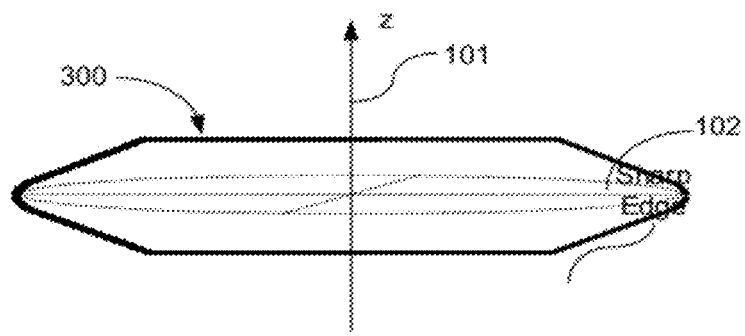

FIGS. 2A, 2B, and 3 illustrate three exemplary WGM resonators. FIG. 2A shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2B shows an exemplary spheroidal microresonator 200. This resonator 200 may be formed by revolving an ellipse (with axial lengths a and b) around the symmetric axis along the short elliptical axis 101 (z). Therefore, similar to the spherical resonator in FIG. 2A, the plane 102 in FIG. 2B also has a circular circumference and is a circular cross section. Different from the design in FIG. 2A, the plane 102 in FIG. 2B is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 2A and 2B, the exterior surface provides curvatures in both the direction in the plane 102 and the direction of z perpendicular to the plane 102 to confine and support the WG modes. Such a non-spherical, non-elliptical surface may be, among others, a parabola or hyperbola. Note that the plane 102 in FIG. 3 is a circular cross section and a WG mode circulates around the circle in the equator.

The above three exemplary geometries in FIGS. 2A, 2B and 3 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to form the WGM resonator. For example, rings, disks and other geometries formed from a proper section of a sphere may be used as a spherical WGM resonator.

Figure 4A:
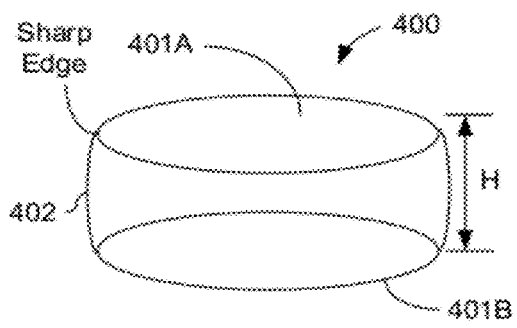
Figure 4B:
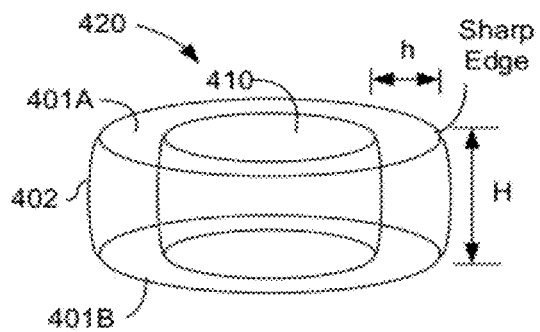

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIG. 3, 4A, and 4B. The exterior curved surface 402 can be selected from any of the shapes shown in FIGS. 2A, 2B and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

Figure 5A:
Figure 5B:

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

WGM resonators can be used to provide an effective way to confine photons in small volumes for long periods of time. As such, WGM resonators have a wide range of applications in both fundamental studies and practical devices. For example, WGM resonators can be used for storage of light with linear optics, as an alternative to atomic light storage, as well as in tunable optical delay lines, a substitute for atomic-based slow light experiments. WGM resonators can also be used for optical filtering and opto-electronic oscillators, among other applications.

Amongst many parameters that characterize a WGM resonator (such as efficiency of in and out coupling, mode volume, free spectral range, etc.) the quality factor (Q) is a basic one. The Q factor is related to the lifetime of light energy in the resonator mode ($\tau$) as $Q=2\pi U\tau$, where v is the linear frequency of the mode. The ring down time corresponding to a mode with $Q=2\times10^{10}$ and wavelength $\Sigma=1.3$ Tm is 15 Ts, thus making ultrahigh Q resonators potentially attractive as light storage devices. Furthermore, some crystals are transparent enough to allow extremely high-Q whispering gallery modes while having important nonlinear properties to allow continuous manipulation of the WGMs' characteristics and further extend their usefulness.

In a dielectric resonator, the maximum quality factor cannot exceed $Q_{max}=2\pi n_0/(\Sigma I)$, where no is the refractive index of the material, $\Sigma$ is the wavelength of the light in vacuum, and I is the absorption coefficient of the dielectric material. The smaller the absorption, the larger is $Q_{max}$. Hence, to predict the narrowest possible linewidth $K=\tau^{-1}$ of a WGM one has to know the value of optical attenuation in transparent dielectrics—within their transparency window—within which the losses are considered negligible for the vast majority of applications. This question about the residual fundamental absorption has remained unanswered for most materials because of a lack of measurement methods with adequate sensitivity. Fortunately, high-Q whispering gallery modes themselves represent a unique tool to measure very small optical attenuations in a variety of transparent materials.

Previous experiments with WGM resonators fabricated by thermal reflow methods applicable to amorphous materials resulted in Q factors less than $9\times10^9$. The measurements were performed with fused silica microcavities, where surface-tension forces produced nearly perfect resonator surfaces, yielding a measured Q factor that approached the fundamental limit determined by the material absorption. It is expected that optical crystals would have less loss than fused silica because crystals theoretically have a perfect lattice without inclusions and inhomogeneities that are always present in amorphous materials. The window of transparency for many crystalline materials is much wider than that of fused silica. Therefore, with sufficiently high-purity material, much smaller attenuation in the middle of the transparency window can be expected-as both the Rayleigh scattering edge and multiphonon absorption edge are pushed further apart towards ultraviolet and infrared regions, respectively. Moreover, crystals may suffer less, or not at all, the extrinsic absorption effects caused by chemosorption of OH ions and water, a reported limiting factor for the Q of fused silica near the bottom of its transparency window at 1.55 µm.

Until recently, one remaining problem with the realization of crystalline WGM resonators was the absence of a fabrication process that would yield nanometer-scale smoothness of spheroidal surfaces for elimination of surface scattering. Very recently this problem was solved. Mechanical optical polishing techniques have been used for fabricating ultrahigh-Q crystalline WGM resonators with Q approaching $10^9$. In this document, high quality factors ($Q=2\times10^{10}$) in WGM resonators fabricated with transparent crystals are further described.

Crystalline WGM resonators with kilohertz-range resonance bandwidths at the room temperature and high resonance contrast (50% and more) are promising for integration into high performance optical networks. Because of small modal volumes and extremely narrow single-photon resonances, a variety of low-threshold nonlinear effects can be observed in WGM resonators based on small broadband nonlinear susceptibilities. As an example, below we report the observation of thermo-optical instability in crystalline resonators, reported earlier for much smaller volume high-Q silica microspheres.

There is little consistent experimental data on small optical attenuation within transparency windows of optical crystals. For example, the high sensitivity measurement of the minimum absorption of specially prepared fused silica, I=0.2 dB/km at $\Sigma=1.55$ Tm, $(-I\geq10^{-7}$ cm$^{-1})$ becomes possible only because of kilometers of optical fibers fabricated from the material. Unfortunately, this method is not applicable to crystalline materials. Fibers have also been grown out of crystals such as sapphire, but attenuation in those (few dB per meter) was determined by scattering of their surface. Calorimetry methods for measurement of light absorption in transparent dielectrics give an error on the order of $-I\geq10^{-7}$ cm$^{-1}$. Several transparent materials have been tested for their residual absorption with calorimetric methods, while others have been characterized by direct scattering experiments, both yielding values at the level of a few ppm/cm of linear attenuation, which corresponds to the Q limitation at the level of $10^{10}$. The question is if this is a fundamental limit or the measurement results were limited by the imperfection of crystals used.

Selection of material for highest-Q WGM resonators must be based on fundamental factors, such as the widest transparency window, high-purity grade, and environmental stability. Alkali halides may not be suitable due to their hygroscopic property and sensitivity to atmospheric humidity. Bulk losses in solid transparent materials can be approximated with the phenomenological dependence $$\alpha \cong \alpha_{UV} e^{\lambda_{UV}/\lambda} + \alpha_R \lambda^{-4} + \alpha_{IR} e^{-\lambda_{IR}/\lambda}, \qquad (1)$$

where $I_{UV}$, $I_R$, and $I_{IR}$ represent the blue wing (primary electronic), Rayleigh, and red wing (multiphonon) losses of the light, respectively; $\Sigma_{UV}$, and $\Sigma_{IR}$ stand for the edges of the material transparency window. This expression does not take into account resonant absorption due to possible crystal impurities. Unfortunately, coefficients in Eq. (1) are not always known.

One example of nonlinear materials for fabrication of high-Q WGM resonators with optical nonlinear behaviors is calcium fluoride (CaF$_2$). This material is useful in various applications because of its use in ultraviolet lithography applications at 193 and 157 nm. Ultrapure crystals of this material suitable for wide aperture optics have been grown, and are commercially available. According to recently reported measurements on scattering in CaF$_2$ I=$3\times10^{-5}$ cm$^{-1}$ at 193 nm, extremely small scattering can be projected in the near-infrared band corresponding to the limitation of Q at the level of $10^{13}$.

Lattice absorption at this wavelength can be predicted from the position of the middle infrared multiphonon edge, and yields even smaller Q limitations. Because of residual doping and nonstoichiometry, both scattering and absorption are present and reduce the Q in actual resonators. An additional source for Q limitation may be the scattering produced by the residual surface inhomogeneities resulting from the polishing techniques. At the limit of conventional optical polishing quality (average roughness σ=2 nm), the estimates based on the waveguide model for WGM surface scattering yield $Q \cong 10^{11}$.

We studied WGM resonators fabricated with calcium fluoride and a few other crystalline materials made of $LiNbO_3$, $LiTaO_3$ and $Al_2O_3$, and measured their quality factors. $CaF_2$ resonators were fabricated by core-drilling of cylindrical preforms and subsequent polishing of the rim of the preforms into spheroidal geometry. The fabricated resonators had a diameter of 4-7 millimeters and a thickness of 0.5-1 mm. The fabricated Calcium fluoride resonators had a Q factor of about $2 \times 10^{10}$.

Measurement of the Q was done using the prism coupling method. The intrinsic Q was measured from the bandwidth of the observed resonances in the undercoupled regime. Because of different refraction indices in resonators, we used BK7 glass prisms (n=1.52) for silica (n=1.44) and calcium fluoride (n=1.43), diamond (n=2.36) for lithium niobate (n=2.10, 2.20), and lithium niobate prism (n=2.10) for sapphire (n=1.75). We used extended cavity diode lasers at 760 nm, distributed feedback semiconductor lasers at 1550 nm, and solid-state YAG lasers at 1319 nm as the light source.

A high-Q nonlinear WGM resonators can be used for achieving low-threshold optical hyperparametric oscillations. The oscillations result from the resonantly enhanced four-wave mixing occurring due to the Kerr nonlinearity of the material. Because of the narrow bandwidth of the resonator modes as well as the high efficiency of the resonant frequency conversion, the oscillations produce stable narrow-band beat-note of the pump, signal, and idler waves. A theoretical model for this process is described.

Realization of efficient nonlinear optical interactions at low light levels has been one of the main goals of non-linear optics since its inception. Optical resonators contribute significantly to achieving this goal, because confining light in a small volume for a long period of time leads to increased nonlinear optical interactions. Optical whispering gallery mode (WGM) resonators are particularly well suited for the purpose. Features of high quality factors (Q) and small mode volumes have already led to the observation of low-threshold lasing as well as efficient nonlinear wave mixing in WGM resonators made of amorphous materials.

Optical hyperparametric oscillations, dubbed as modulation instability in fiber optics, usually are hindered by small nonlinearity of the materials, so high-power light pulses are required for their observation. Though the nonlinearity of $CaF_2$ is even smaller than that of fused silica, we were able to observe with low-power continuous wave pump light a strong nonlinear interaction among resonator modes resulting from the high Q ($Q > 5 \times 10^9$) of the resonator. New fields are generated due to this interaction.

The frequency of the microwave signal produced by mixing the pump and the generated side-bands on a fast photodiode is stable and does not experience a frequency shift that could occur due to the self- and cross-phase modulation effects. Conversely in, e.g., coherent atomic media, the oscillations frequency shifts to compensate for the frequency mismatch due to the cross-phase modulation effect (ac Stark shift). In our system the oscillation frequency is given by the mode structure and, therefore, can be tuned by changing the resonator dimensions. Different from resonators fabricated with amorphous materials and liquids, high-Q crystalline resonators allow for a better discrimination of the third-order nonlinear processes and the observation of pure hyperparametric oscillation signals. As a result, the hyperoscillator is promising for applications as an all-optical secondary frequency reference.

The hyperparametric oscillations could be masked with stimulated Raman scattering (SRS) and other non-linear effects. For example, an observation of secondary lines in the vicinity of the optical pumping line in the SRS experiments with WGM silica microresonators was interpreted as four-wave mixing between the pump and two Raman waves generated in the resonator, rather than as the four-photon parametric process based on electronic Kerr nonlinearity of the medium. An interplay among various stimulated nonlinear processes has also been observed and studied in droplet spherical microcavities.

The polarization selection rules together with WGM's geometrical selection rules allow for the observation of nonlinear processes occurring solely due to the electronic nonlinearity of the crystals in crystalline WGM resonators. Let us consider a fluorite WGM resonator possessing cylindrical symmetry with symmetry axis. The linear index of refraction in a cubic crystal is uniform and isotropic, therefore the usual description of the modes is valid for the resonator. The TE and TM families of WGMs have polarization directions parallel and orthogonal to the symmetry axis, respectively. If an optical pumping light is sent into a TE mode, the Raman signal cannot be generated in the same mode family because in a cubic crystal such as $CaF_2$ there is only one, triply degenerate, Raman-active vibration with symmetry $F_{2g}$. Finally, in the ultrahigh Q crystalline resonators, due to the material as well as geometrical dispersion, the value of the free spectral range (FSR) at the Raman detuning frequency differs from the FSR at the carrier frequency by an amount exceeding the mode spectral width. Hence, frequency mixing between the Raman signal and the carrier is strongly suppressed. Any field generation in the TE mode family is due to the electronic nonlinearity only, and Raman scattering occurs in the TM modes.

Consider three cavity modes: one nearly resonant with the pump laser and the other two nearly resonant with the generated optical sidebands. Our analysis begins with the following equations for the slow amplitudes of the intracavity fields $$\dot{A} = -\Gamma_0 A + ig[|A|^2 + 2|B_+|^2 + 2|B_-|^2]A + 2igA^* B_+ B_- + F_0,$$

$$\dot{B}_+ = -\Gamma_+ B_+ + ig[2|A|^2 + |B_+|^2 + 2|B_-|^2]B_+ + igB_-^* |A|^2,$$

$$\dot{B}_- = -\Gamma_- B_- + ig[2|A|^2 + 2|B_+|^2 + |B_-|^2]B_- + igB_+^* |A|^2,$$

where $\Gamma_o = i(\omega_o - \omega) + K_o$ and $\Gamma_\pm = i(\omega_\pm - \tilde{\omega}_\pm) + K_\pm$, $K_o$, $K_+$, and $y_-$ as well as $\omega_o$, $\omega_+$, and $\omega_-$ are the decay rates and eigenfrequencies of the optical cavity modes respectively; $\omega$ is the carrier frequency of the external pump (A), $\tilde{\omega}_\pm$ and $\tilde{\omega}_\pm$ are the carrier frequencies of generated light ($B_+$ and $B_{31}$, respectively). These frequencies are determined by the oscillation process and cannot be controlled from the outside. However, there is a relation between them (energy conservation law): $2\omega = \tilde{\omega}_+ + \tilde{\omega}_-$. Dimensionless slowly varying amplitudes A, $B_+$, and $B_-$ are normalized such that $|A|^2$, $|B_+|^2$, and $|B_-|^2$ describe photon number in the corresponding modes. The coupling constant can be found from the following expression $$g = \hbar \omega_0^2 n_2 c / V n_0^2$$

where $n_2$ is an optical constant that characterizes the strength of the optical nonlinearity, $n_o$ is the linear refractive index of the material, V is the mode volume, and c is the speed of light in the vacuum. Deriving this coupling constant we assume that the modes are nearly overlapped geometrically, which is true if the frequency difference between them is small. The force $F_o$ stands for the external pumping of the system $F_o=(2K_oP_o/\omega_o)^{1/2}$, where $P_o$ is the pump power of the mode applied from the outside.

For the sake of simplicity we assume that the modes are identical, i.e., $K_+=K_-=K_o$, which is justified by observation with actual resonators. Then, solving the set (1)-(3) in steady state we find the oscillation frequency for generated fields $$\omega-\tilde{\omega}_-=\tilde{\omega}_+-\omega=\frac{1}{2}(\omega_+-\omega_-),$$

i.e., the beat-note frequency depends solely on the frequency difference between the resonator modes and does not depend on the light power or the laser detuning from the pumping mode. As a consequence, the electronic frequency lock circuit changes the carrier frequency of the pump laser but does not change the frequency of the beat note of the pumping laser and the generated sidebands.

The threshold optical power can be found from the steady state solution of the set of three equations for the slow amplitudes of the intracavity fields:

$$P_{th} \simeq 1.54 \frac{\pi}{2} \frac{n_0^2 V}{n_2 \lambda Q^2},$$

where the numerical factor 1.54 comes from the influence of the self-phase modulation effects on the oscillation threshold. The theoretical value for threshold in our experiment is $P_{th} \approx 0.3$ mW, where $n_o=1.44$ is the refractive index of the material, $n_2=3.2\times10^{-16}$ cm$^2$/W is the nonlinearity coefficient for calcium fluoride, $V=10^{-4}$ cm$^3$ is the mode volume, $Q=6\times10^9$, and $\Sigma=1.32$ μm.

The above equation suggests that the efficiency of the parametric process increases with a decrease of the mode volume. We used a relatively large WGM resonator because of the fabrication convenience. Reducing the size of the resonator could result in a dramatic reduction of the threshold for the oscillation. Since the mode volume may be roughly estimated as $V=2\pi\Sigma R^2$, it is clear that reducing the radius R by an order of magnitude would result in 2 orders of magnitude reduction in the threshold of the parametric process. This could place WGM resonators in the same class as the oscillators based on atomic coherence. However, unlike the frequency difference between sidebands in the atomic oscillator, the frequency of the WGM oscillator could be free from power (ac Stark) shifts.

Analysis based on the Langevin equations describing quantum behavior of the system suggests that the phase diffusion of the beat-note is small, similar to the low phase diffusion of the hyperparametric process in atomic coherent media. Close to the oscillation threshold the phase diffusion coefficient is $$D_{beat} \simeq \frac{\gamma_0^2}{4} \frac{\hbar\omega_0}{P_{Bout}},$$

where $P_{Bout}$ is the output power in a sideband. The corresponding Allan deviation is $\sigma_{beat}/\omega_{beat}=(2D_{beat}/t\omega^2_{beat})^{1/2}$. We could estimate the Allan deviation as follows:

$$\sigma_{beat}/\omega_{beat} \approx 10^{-13}/\sqrt{t}$$

for $K_0=3\times10^5$ rad/s, $P_{Bout}=1$ mW, $\omega_0=1.4\times10^{15}$ rad/s and $\omega_{beat}=5\times10^{10}$ rad/s. Follow up studies of the stability of the oscillations in the general case will be published elsewhere.

Our experiments show that a larger number of modes beyond the above three interacting modes could participate in the process. The number of participating modes is determined by the variation of the mode spacing in the resonator. Generally, modes of a resonator are not equidistant because of the second order dispersion of the material and the geometrical dispersion. We introduce $D=(2\omega_o-\omega_+-\omega_-)/K_o$ to take the second order dispersion of the resonator into account. If $|D|\geq 1$ the modes are not equidistant and, therefore, multiple harmonic generation is impossible.

Geometrical dispersion for the main mode sequence of a WGM resonator is $D \cong 0.41c/(K_0Rn_0m^{5/3})$, for a resonator with radius R; $\omega_+$, $\omega_0$, and $\omega_-$ are assumed to be m+1, m, and m−1 modes of the resonator ($\omega_m Rn_{\omega m}=mc$, m>>1). For R=0.4 cm, $K_0=2\times10^5$ rad/s, $m=3\times10^4$ we obtain $D=7\times10^{-4}$, therefore the geometrical dispersion is relatively small in our case. However, the dispersion of the material is large enough. Using the Sellmeier dispersion equation, we find $D \cong 0.1$ at the pump laser wavelength. This implies that approximately three sideband pairs can be generated in the system (we see only two in the experiment).

Furthermore, the absence of the Raman signal in our experiments shows that effective Raman nonlinearity of the medium is lower than the value measured earlier. Theoretical estimates based on numbers from predict nearly equal pump power threshold values for both the Raman and the hyperparametric processes. Using the expression derived for SRS threshold $P_R \cong \pi 2n_0^2 V/G\Sigma^2Q^2$, where $G \cong 2\times10^{-11}$ cm/W is the Raman gain coefficient for CaF$_2$, we estimate $P_{th}/P_R \approx 1$ for any resonator made of CaF$_2$. However, as mentioned above, we did not observe any SRS signal in the experiment.

Therefore, because of the long interaction times of the pumping light with the material, even the small cubic nonlinearity of CaF$_2$ results in an efficient generation of narrowband optical sidebands. This process can be used for the demonstration of a new kind of an all-optical frequency reference. Moreover, the oscillations are promising as a source of squeezed light because the sideband photon pairs generated in the hyperparametric processes are generally quantum correlated.

Photonic microwave oscillators can be built based on generation and subsequent demodulation of polychromatic light to produce a well defined and stable beat-note signal. Hyperparametric oscillators based on nonlinear WGM optical resonators can be used to generate ultrastable microwave signals. Such microwave oscillators have the advantage of a small size and low input power, and can generate microwave signals at any desired frequency, which is determined by the size of the resonator.

Hyperparametric optical oscillation is based on four-wave mixing among two pump, signal, and idler photons by transforming two pump photos in a pump beam into one signal photon and one idler photon. This mixing results in the growth of the signal and idler optical sidebands from vacuum fluctuations at the expense of the pumping wave. A high intracavity intensity in high finesse WGMs results in $\chi[3]$ based four-photon processes like $h\omega+h\omega \rightarrow h[\omega+\omega M]+h[\omega-\omega M]$, where $\omega$ is the carrier frequency of the external pumping, and $\omega M$ is determined by the free spectral range of the resonator $\omega M \approx \Omega FSR$. Cascading of the process and generating multiple equidistant signal and idler harmonics (optical comb) is also possible in this oscillator. Demodulation of the optical output of the oscillator by means of a fast photodiode results in the generation of high frequency microwave signals at frequency $\omega M$. The spectral purity of the signal increases with increasing Q factor of the WGMs and the optical power of the generated signal and idler. The pumping threshold of the oscillation can be as small as microWatt levels for the resonators with ultrahigh Q-factors.

There are several problems hindering the direct applications of the hyperparametric oscillations. One of those problems is related to the fact that the optical signal escaping WGM resonator is mostly phase modulated. Therefore, a direct detection of the signal on the fast photodiode does not result in generation of a microwave. To go around this discrepancy, the nonlinear WGM resonator can be placed in an arm of a Mach-Zehnder interferometer with an additional delay line in another arm of the interferometer. The optical interference of the light from the two arms allows transforming phase modulated signal into an amplitude modulated signal which can be detected by an optical detector to produce a microwave signal.

Figure 6A:
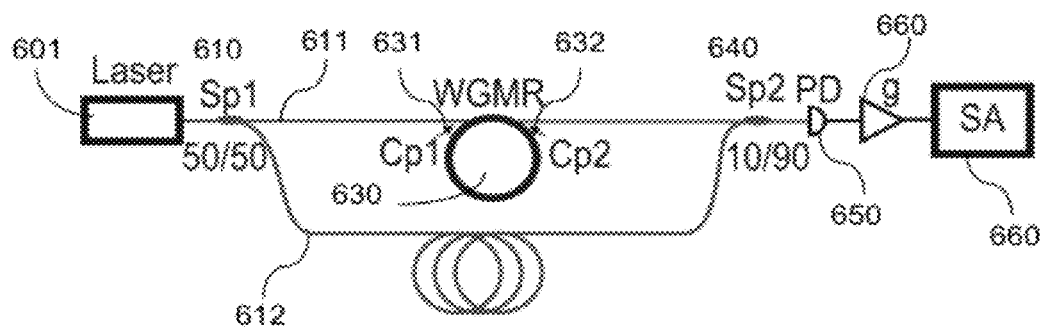
FIGS. 6A, 6B and 6C show examples of RF or microwave oscillators based on nonlinear WGM resonators.

FIG. 6A shows an example of a hyperparametric microwave photonic oscillator in an optical interferometer configuration with a first optical path 1611 having the nonlinear WGM resonator 630 and a second optical path 612 with a long delay line. Light from a laser 601 is split into the two paths 611 and 612. Two coupling prisms 631 and 632 or other optical couplers can be used to optically couple the resonator 630 to the first optical path 611. The output light of the resonator 630 is collected into a single-mode fiber after the coupling prism 632 and is combined with the light from the optical delay line. The combined light is sent to a photodiode PD 650 which produces a beat signal as a narrow-band microwave signal with low noise. A signal amplifier 660 and a spectrum analyzer 660 can be used downstream from the photodiode 650.

Figure 6B:
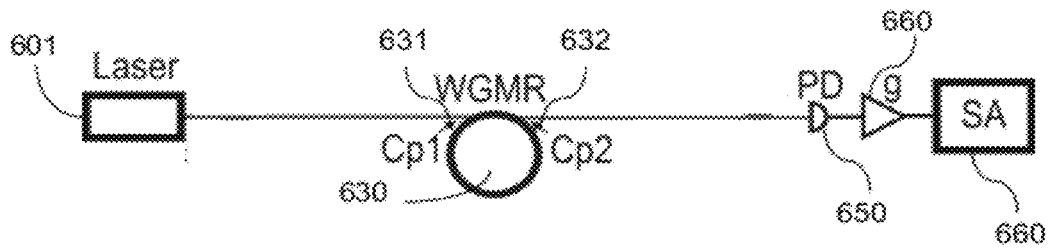

FIG. 6B shows an example of a hyperparametric microwave photonic oscillator in which the oscillator is able to generate microwave signals without a delay in the above interferometer configuration in FIG. 6A. This simplifies packaging the device.

Figure 6C:
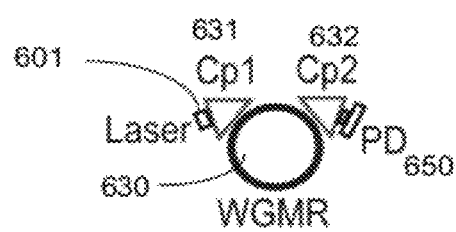

FIG. 6C shows an oscillator where a laser diode 601 is directly coupled to an optical coupling element CP1 (631, e.g., a coupling prism) that is optically coupled to the WDM nonlinear resonator 630 and a second optical coupling element CP2 (632, e.g., a coupling prism) is coupled to the resonator 630 to produce an optical output. The photodiode PD 650 is coupled to the CP2 to convert the optical output received by the photodiode 650 into a low noise RF/microwave signal.

The above designs without the optical delay line are based on single sideband four wave mixing process occurring in the resonators. A single sideband signal does not require any interferometric technique to generate a microwave signal on the photodiode.

Figure 7:
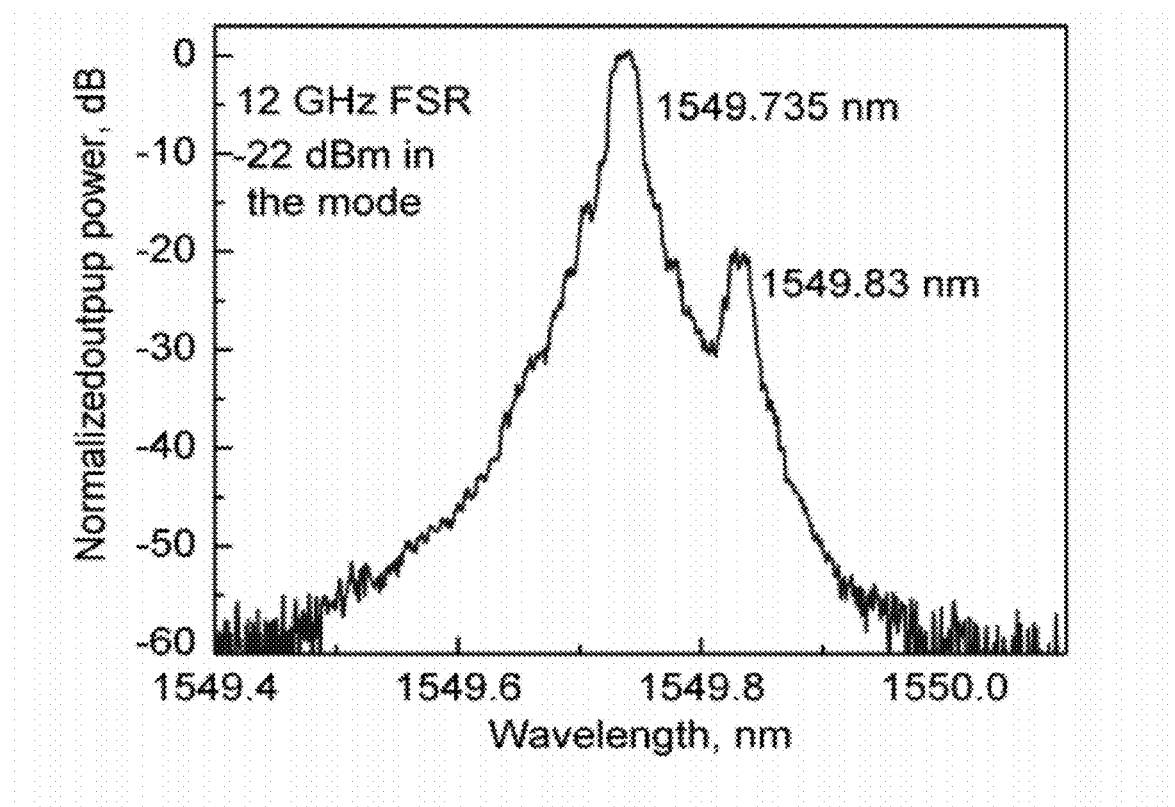
FIGS. 7 and 8 illustrate operations of nonlinear WGM resonators under optical pumping.

An example of the single-sideband signal is shown in FIG. 7, which shows experimentally observed spectrum of the hyperparametric oscillator. The oscillator has only one sideband separated with the carrier by resonator FSR (12 GHz), unlike to the usual hyperparametric oscillator having symmetric sidebands. The optical signal generates 12 GHz spectrally pure microwave signal on a fast photodiode.

The single-sideband oscillator is suitable for packaging of the device in a small package. The process occurs due to the presence of multiple frequencies degenerate optical modes in a WGM resonator. The modes interfere on the resonator surface. The interference results in specific spatial patterns on the resonator surface. Each sideband generated in the resonator has its own unique pattern. Selecting the right geometrical position of the output coupler on the surface of the resonator, it is possible to retrieve the carrier and only one generated sideband.

Figure 8:
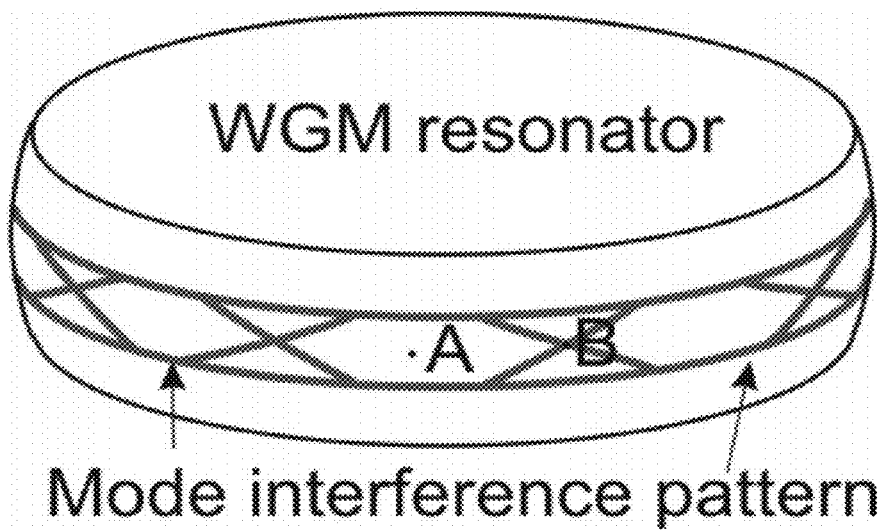

FIG. 8 illustrates that monochramatic light interacting simultaneously with several degenerate or nearly degenerate modes of a WGM resonator results in the interference pattern on the resonator surface. The pattern is stationary in time if the modes are completely degenerate. Selecting right position for the output coupler allows detection of the output light (e.g., at point A). At the point B, however, there is a null in the optical field so that no light is detected when the coupler is placed at B.

Therefore, a single sideband oscillator can be made by using a nonlinear WGM resonator with comparably high spectral density and an output evanescent field coupler that can be positioned in the proximity of the resonator surface. We have shown experimentally that by selecting the proper point on the resonator surface it is possible to observe optical hyperparametric oscillations with only one sideband generated. Such an oscillation can be demodulated directly on a fast photodiode.

The hyperparametric oscillator produces a high spectral purity for the microwave signal generated at the output of the photodetector. We have measured phase noise of the signals and found that it is shot noise limited and that the phase noise floor can reach at least −126 dBc/Hz level. To improve the spectral purity we can oversaturate the oscillator and generate an optical comb. Microwave signals generated by demodulation of the optical comb have better spectral purity compared with the single-sideband oscillator. Optical comb corresponds to mode locking in the system resulting in generation of short optical pulses. We have found that the phase noise of the microwave signal generated by the demodulation of the train of optical pulses with duration t and repetition rate T is given by shot noise with a power spectral density given by $$S_\phi(\omega) \approx \frac{2\hbar\omega_0}{P_{ave}\omega^2} \frac{4\pi^2 \alpha t^2}{T^4}$$

where $\omega 0$ is the frequency of the optical pump, $P_{ave}$ is the averaged optical power of the generated pulse train, $\alpha$ is the round trip optical loss. Hence, the shorter is the pulse compared with the repetition rate the smaller is the phase noise. On the other hand we know that T/t is approximately the number of modes in the comb N. Hence, we expect that the comb will have much lower (N^2) phase noise compared with usual hyperparametric oscillator having one or two sidebands.

Nonlinear WGM resonators with the third order nonlinearities, such as CaF2 WGM resonators, can be used to construct tunable optical comb generators. A CaF2 WGM resonator was used to generate optical combs with 25m GHz frequency spacing (m is an integer number). The spacing (the number m) was changed controllably by selecting the proper detuning of the carrier frequency of the pump laser with respect to a selected WGM frequency. Demodulation of the optical comb by means of a fast photodiode can be used to generate high-frequency microwave signals at the comb repetition frequency or the comb spacing. The linewidth of generated 25 GHz signals was less than 40 Hz.

Such a comb generator includes a laser to produce the pump laser beam, a nonlinear WGM resonator and an optical coupling module to couple the pump laser beam into the nonlinear WGM resonator and to couple light out of the nonlinear WGM resonator. Tuning of the frequencies in the optical comb can be achieved by tuning the frequency of the pump laser beam and the comb spacing can be adjusted by locking the pump laser to the nonlinear WGM resonator and controlling the locking condition of the pump laser.

Figure 9:
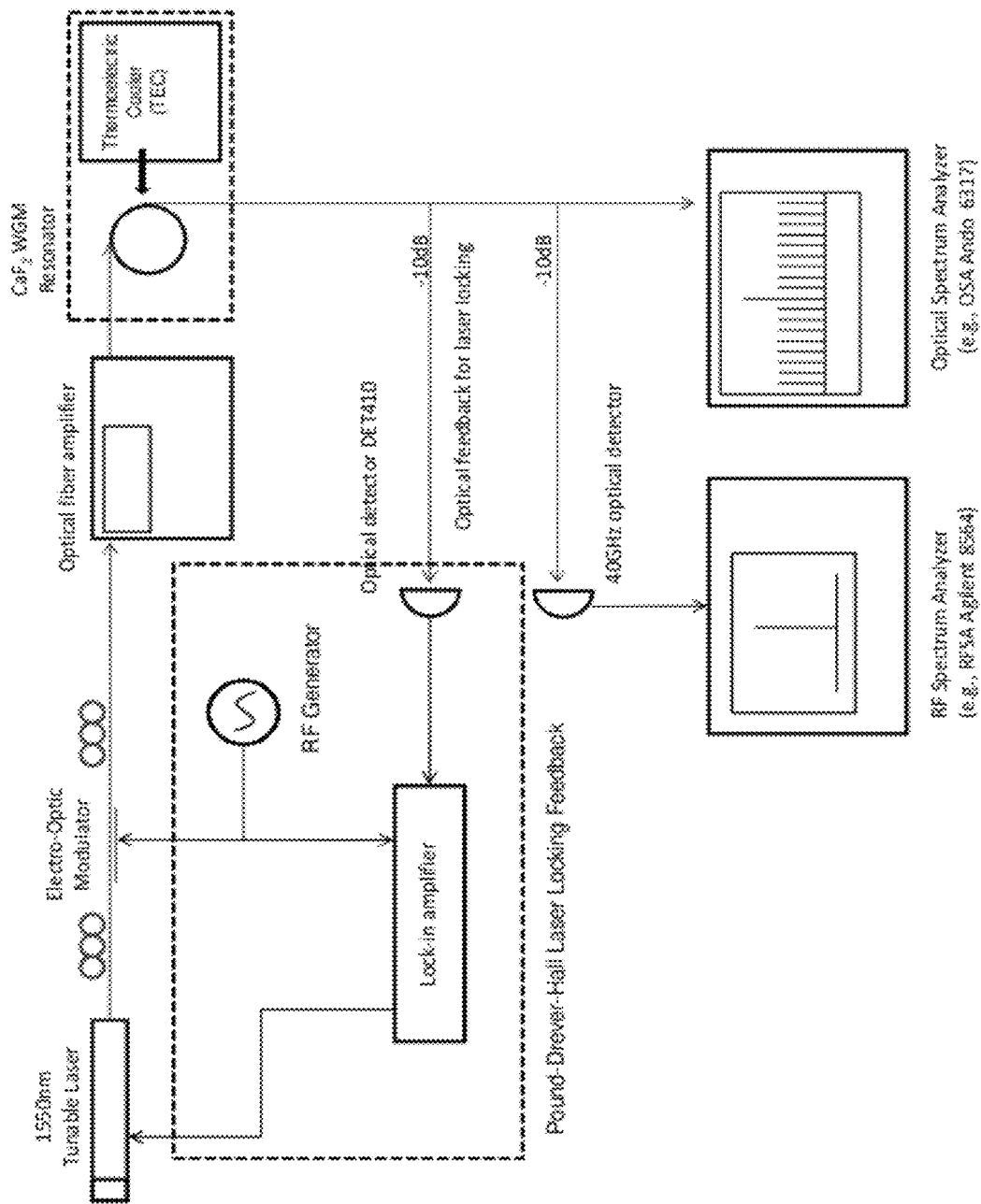
FIG. 9 shows a Pound-Drever-Hall (PDH) laser feedback locking scheme for locking a laser to a nonlinear WGM resonator.

FIG. 9 shows an example of such a comb generator. Pump light from the laser, e.g., a 1550 nm tunable laser coupled to a fiber, is sent into a CaF2 WGM resonator using a coupling prism, and was retrieved out of the resonator using another coupling prism. The light escaping the prism is collimated and coupled into a single mode fiber. The coupling efficiency can be set, e.g., higher than 35%. The resonator may have a conical shape with the rounded and polished rim. The CaF2 WGM resonator used in our tests is 2.55 mm in diameter and 0.5 mm in thickness. The intrinsic Q factor was on the order of $2.5 \times 10^9$. The proper shaping of the resonator can reduce the mode cross section area to less than a hundred of square microns. The resonator can be packaged into a thermally stabilized box, e.g., by using a thermoelectric cooler (TEC), to compensate for external thermal fluctuations. The optical output of the resonator was directed to an optical spectrum analyzer (OSA) to measure the optical spectral properties of the output and a photodetector and an RF spectrum analyzer (RFSA) to measure the RF or microwave spectral properties of the output of the photodetector.

In FIG. 9, the laser frequency is locked to a mode of the WGM resonator. As illustrated, a Pound-Drever-Hall laser feedback locking system is used where a part of the optical output of the WGM resonator is used as the optical feedback for laser locking. The level and the phase of the laser locking are set to be different for the oscillating and nonoscillating resonator. Increasing the power of the locked laser above the threshold of the oscillation causes the lock instability. This is expected since the symmetry of the resonance changes at the oscillation threshold. The lock parameters can be modified or adjusted while increasing the laser power to keep the laser locked. While the laser is locked to the WGM resonator, the detuning of the laser frequency from the resonance frequency of the WGM resonator can be changed to tune the comb by modifying the lock parameters.

When the WGM resonator is optically pumped at a low input level when the pumping power approaches the threshold of the hyperparametric oscillations, no optical comb is generated and a competition of stimulated Raman scattering (SRS) and the FWM processes is observed. The WGM resonator used in our tests had multiple mode families of high Q WGMs. We found that SRS has a lower threshold compared with the FWM oscillation process in the case of direct pumping of the modes that belong to the basic mode sequence. This is an unexpected result because the SRS process has a somewhat smaller threshold compared with the hyperparametric oscillation in the modes having identical parameters. The discrepancy is due to the fact that different mode families have different quality factors given by the field distribution in the mode, and positions of the couplers. The test setup was arranged in such a way that the basic sequence of the WGMs had lower Q factor (higher loading) compared with the higher order transverse modes. The SRS process starts in the higher-Q modes even though the modes have larger volume V. This happens because the SRS threshold power is inversely proportional to $VQ^2$.

Figure 10:
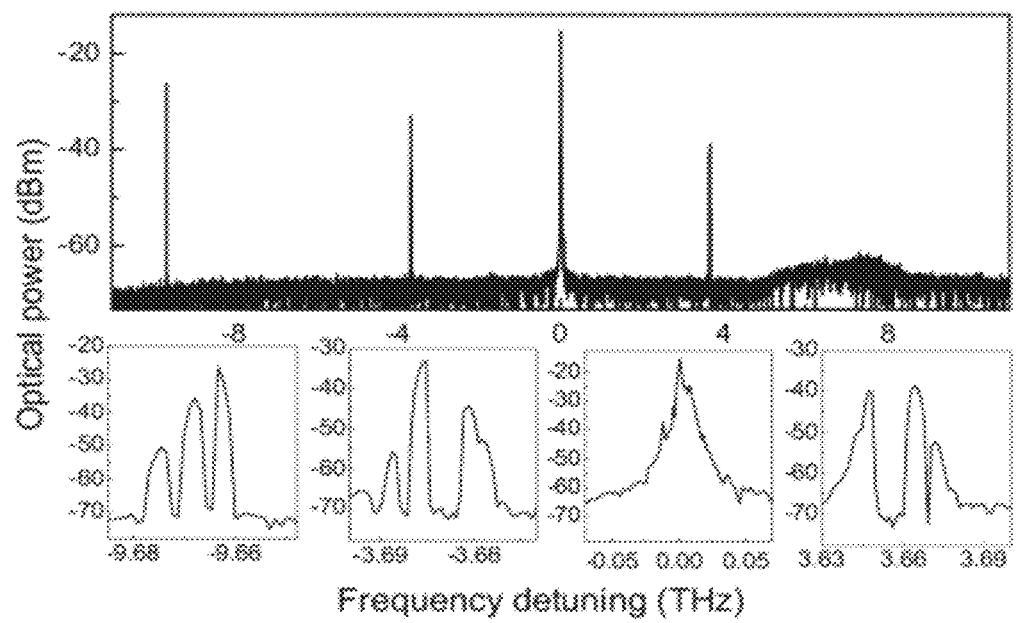
FIGS. 10-15 show measurements of sample nonlinear WGM resonators for generating optical comb signals.

Pumping of the basic mode sequence with larger power of light typically leads to hyperparametric oscillation taking place along with the SRS. FIG. 10 shows a measured frequency spectrum of the SRS at about 9.67 THz from the optical carrier and hyperparametric oscillations observed in the CaF2 resonator pumped to a mode belonging to the basic mode sequence. The structure of the lines is shown by inserts below the spectrum. The loaded quality factor Q was $10^9$ and the pump power sent to the modes was 8 mW. Our tests indicated that hyperparametric and SRS processes start in the higher Q modes. The frequency separation between the modes participating in these processes is much less than the FSR of the resonator and the modes are apparently of transverse nature. This also explains the absence of FWM between the SRS light and the carrier.

The photon pairs generated by FWM are approximately 8 THz apart from the pump frequency as shown in FIG. 10. This is because the CaF2 has its zero-dispersion point in the vicinity of 1550 nm. This generation of photon pairs far away from the pump makes the WGM resonator-based hyperparametric oscillator well suited for quantum communication and quantum cryptography networks. The oscillator avoids large coupling losses occurring when the photon pairs are launched into communication fibers, in contrast with the traditional twin-photon sources based on the $\chi(2)$ down-conversion process. Moreover, a lossless separation of the narrow band photons with their carrier frequencies several terahertz apart can be readily obtained.

In the tests conducted, optical combs were generated when the pump power increased far above the oscillation threshold. Stable optical combs were generated when the frequency of the laser was locked to a high Q transverse WGM. In this way, we observed hyperparametric oscillation with a lower threshold compared with the SRS process. Even a significant increase of the optical pump power did not lead to the onset of the SRS process because of the fast growth of the optical comb lines.

Figure 11:
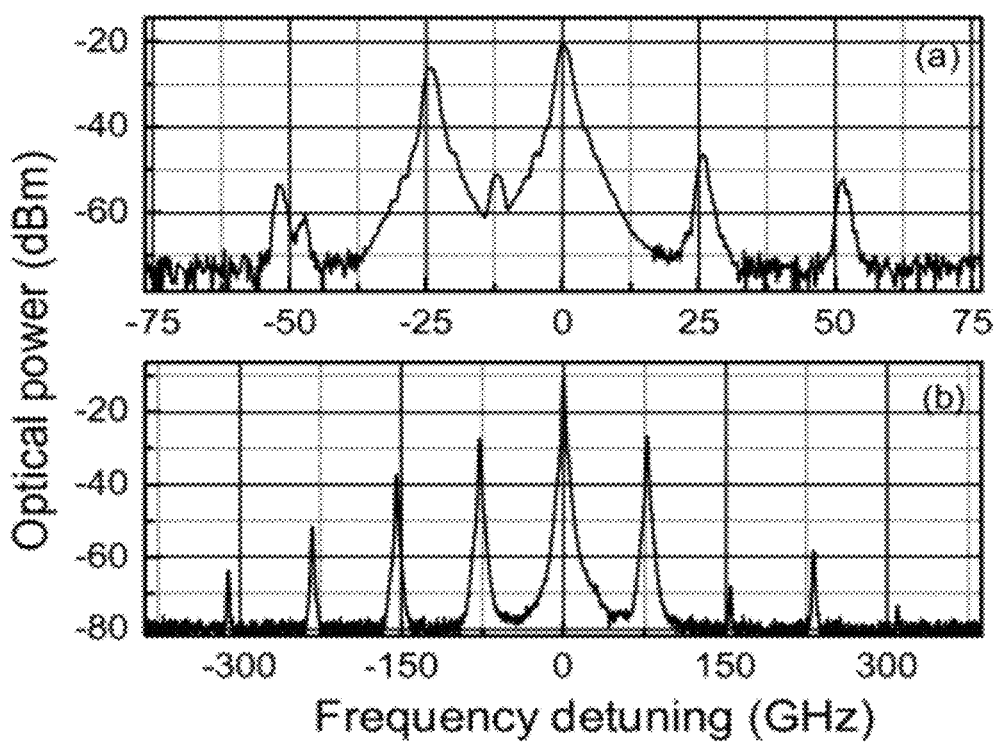

FIG. 11 shows examples of hyperparametric oscillation observed in the resonator pumped with 10 mW of 1550 nm light. Spectra (a) and (b) correspond to different detuning of the pump from the WGM resonant frequency. The measured spectrum (a) shows the result of the photon summation process when the carrier and the first Stokes sideband, separated by 25 GHz, generate photons at 12.5 GHz frequency. The process is possible because of the high density of the WGMs and is forbidden in the single mode family resonators.

The growth of the combs has several peculiarities. In some cases, a significant asymmetry was present in the growth of the signal and idler sidebands as shown in FIG. 11. This asymmetry is not explained with the usual theory of hyperparametric oscillation which predicts generation of symmetric sidebands. One possible explanation for this is the high modal density of the resonator. In the experiment the laser pumps not a single mode, but a nearly degenerate mode cluster. The transverse mode families have slightly different geometrical dispersion so the shape of the cluster changes with frequency and each mode family results in its own hyperparametric oscillation. The signal and idler modes of those oscillations are nearly degenerate so they can interfere, and interference results in sideband suppression on either side of the carrier. This results in the "single sideband" oscillations that were observed in our tests. The interfering combs should not be considered as independent because the generated sidebands have a distinct phase dependence, as is shown in generation of microwave signals by comb demodulation.

Figure 12:
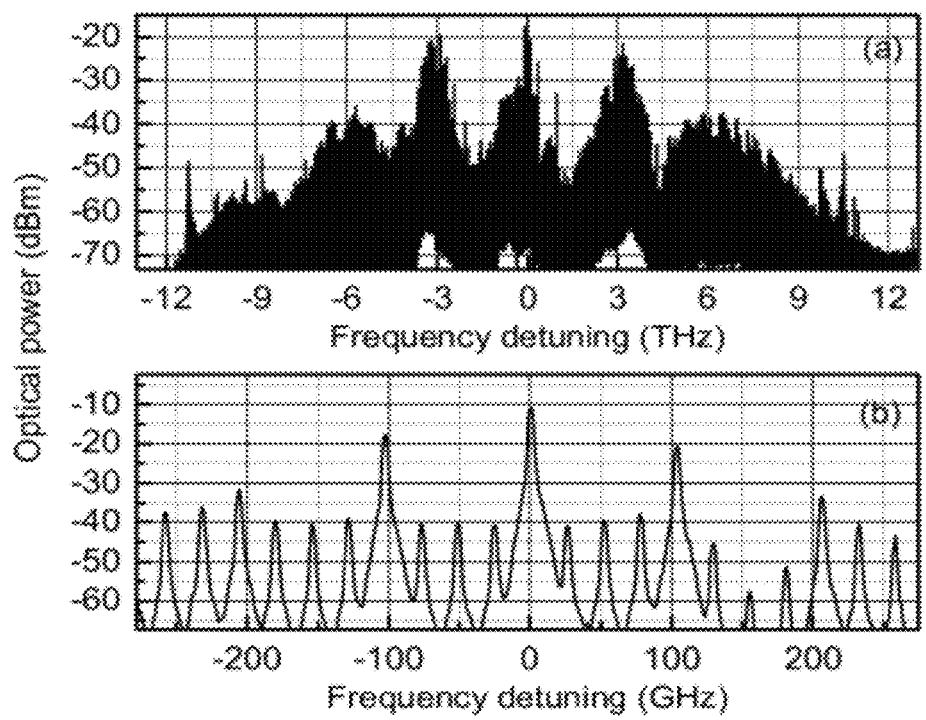
Figure 13:
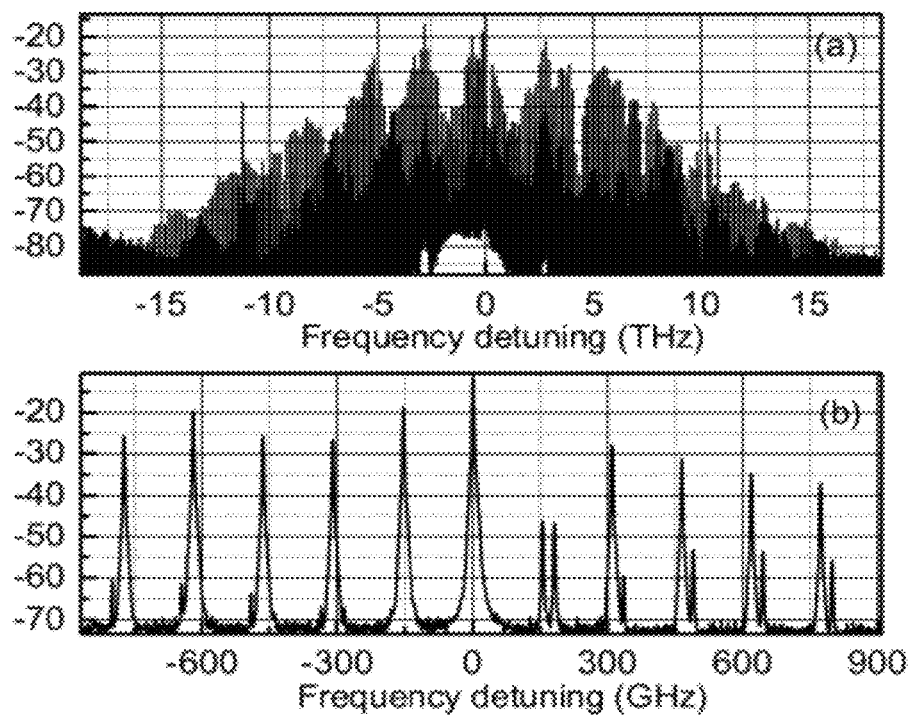

FIG. 12 shows (a) the optical comb generated by the CaF2 WGM resonator pumped at by a pump laser beam of 50 mW in power, and (b) the enlarged central part of the measurement in (a). The generated optical comb has two definite repetition frequencies equal to one and four FSRs of the resonator. FIG. 13 shows the modification of the comb shown in FIG. 12 when the level and the phase of the laser lock were changed. FIG. 13(b) shows the enlarged central part of the measurement in FIG. 13(a).

The interaction of the signal and the idler harmonics becomes more pronounced when the pump power is further increased beyond the pump threshold at which the single sideband oscillation is generated. FIGS. 12 and 13 show observed combs with more than 30 THz frequency span. The envelopes of the combs are modulated and the reason for the modulation can be deduced from FIG. 13(b). The comb is generated over a mode cluster that changes its shape with frequency.

The above described nonlinear WGM resonator-based optical comb generator can be tuned and the controllable tuning of the comb repetition frequency is achieved by changing the frequency of the pump laser. Keeping other experimental conditions unchanged (e.g., the temperature and optical coupling of the resonator), the level and the phase of the laser lock can be changed to cause a change in the comb frequency spacing. The measurements shown in FIGS. 11-13 provide examples for the tuning. This tuning capability of nonlinear WGM resonator-based comb generators is useful in various applications.

Figure 14:
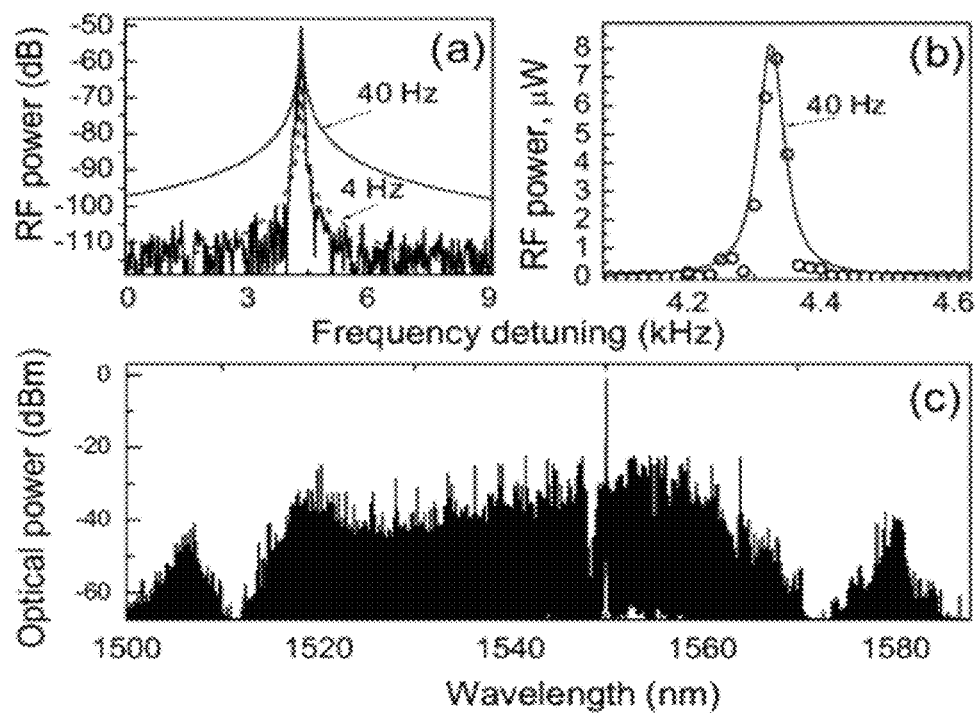

Another feature of nonlinear WGM resonator-based comb generators is that the different modes of the optical comb are coherent. The demodulation of the Kerr (hyperparametric) frequency comb so generated can be directly detected by a fast photodiode to produce a high frequency RF or microwave signal at the comb repetition frequency. This is a consequence and an indication that the comb lines are coherent. The spectral purity of the signal increases with increasing Q factor of the WGMs, the optical power of the generated sidebands, and the spectral width of the comb. The output of the fast photodiode is an RF or microwave beat signal caused by coherent interference between different spectral components in the comb. To demonstrate the coherent properties of the comb, a comb with the primary frequency spacing of 25 GHz was directed into a fast 40-GHz photodiode with an optical band of 1480-1640 nm. FIG. 14 shows the recorded the microwave beat signal output by the 40-GHz photodiode. FIG. 14(a) shows the signal in the logarithmic scale and FIG. 14(b) shows the same signal in the linear scale. FIG. 14(c) shows the spectrum of the optical comb directed into the 40-GHz photodiode. The result of the linear fit of the microwave line indicates that the generated microwave beat signal has a linewidth less than 40 Hz, indicating high coherence of the beat signal. A microwave spectrum analyzer (Agilent 8564A) used in this experiment has a 10 Hz video bandwidth, no averaging, and the internal microwave attenuation is 10 dB (the actual microwave noise floor is an order of magnitude lower). No optical postfiltering of the optical signal was involved.

FIG. 14 also indicates that the microwave signal is inhomogeneously broadened to 40 Hz. The noise floor corresponds to the measurement bandwidth (approximately 4 Hz). The broadening comes from the thermorefractive jitter of the WGM resonance frequency with respect to the pump laser carrier frequency. The laser locking circuit based on 8-kHz modulation used in the test is not fast enough to compensate for this jitter. A faster lock (e.g., 10 MHz) may be used to allow measuring a narrower bandwidth of the microwave signal.

The comb used in the microwave generation in FIG. 14(c) has an asymmetric shape. Unlike the nearly symmetric combs in FIGS. 12 and 13, this comb is shifted to the blue side of the carrier. To produce the comb in FIG. 14(c), the laser was locked to one of the modes belonging to the basic mode sequence. We observed the two mode oscillation process as in FIG. 10 for lower pump power that transformed into the equidistant comb as the pump power was increased. The SRS process was suppressed.

Figure 15:
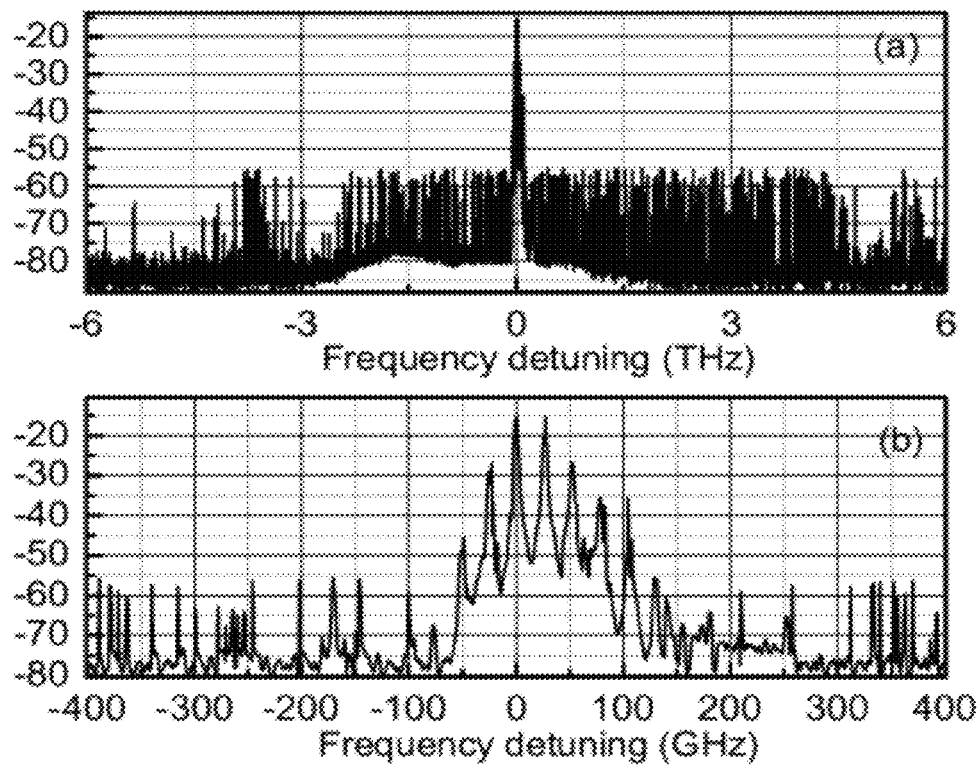

In a different test, an externally modulated light signal was sent to the nonlinear WGM resonator as the optical pump. FIG. 15 shows measured chaotic oscillations measured in the optical output of the nonlinear WGM resonator. The resonator was pumped with laser light at 1550 nm that is modulated at 25 786 kHz and has a power of 50 mW. The generated spectrum is not noticeably broader than the spectrum produced with a cw pumped resonator and the modes are not equidistant.

Therefore, optical frequency combs can be generated by optically pumping a WGM crystalline resonator to provide tunable comb frequency spacing corresponding to the FSR of the resonator. The combs have large spectral widths (e.g., exceeding 30 THz) and good relative coherence of the modes. The properties of the generated combs depend on the selection of the optically pumped mode, and the level and the phase of the lock of the laser to the resonator.

The above described generation of optical combs using optical cubic nonlinearity in WGM resonators can use laser locking to stabilize the frequencies of the generated optical comb signals. As illustrated in FIG. 9, a Pound-Drever-Hall (PDH) laser feedback locking scheme can be used to lock the laser that produces the pump light to the nonlinear WGM resonator. The PDH locking is an example of laser locking techniques based on a feedback locking circuit that uses the light coupled of the resonator to produce an electrical control signal to lock the laser to the resonator. The level and the phase of the lock are different for the oscillating and non-oscillating resonators. Increasing the power of the locked laser above the threshold of the oscillation causes the lock instability. This locking of the laser can facilitate generation of spectrally pure microwave signals. Tests indicate that the unlocked comb signals tend to have border linewidths (e.g., about MHz) than linewidths generated by a comb generator with a locked laser, e.g., less than 40 Hz as shown in FIG. 14.

Alternative to the Pound-Drever-Hall (PDH) laser feedback locking, Rayleigh scattering inside a WGM resonator or a solid state ring resonator can be used to lock a laser to such a resonator in a form of self injection locking. This injection locking locks a laser to a nonlinear resonator producing a hyperparametric frequency comb by injecting light of the optical output of the nonlinear resonator under optical pumping by the laser light of the laser back into the laser under a proper phase matching condition. The optical phase of the feedback light from the nonlinear resonator to the laser is adjusted to meet the phase matching condition.

Two feedback mechanisms can be used to direct light from the nonlinear resonator to the laser for locking the laser. The first feedback mechanism uses the signal produced via Rayleigh scattering inside the nonlinear resonator. The light caused by the Rayleigh scattering traces the optical path of the original pump light from the laser to travel from the nonlinear resonator to the laser.

Figure 16:
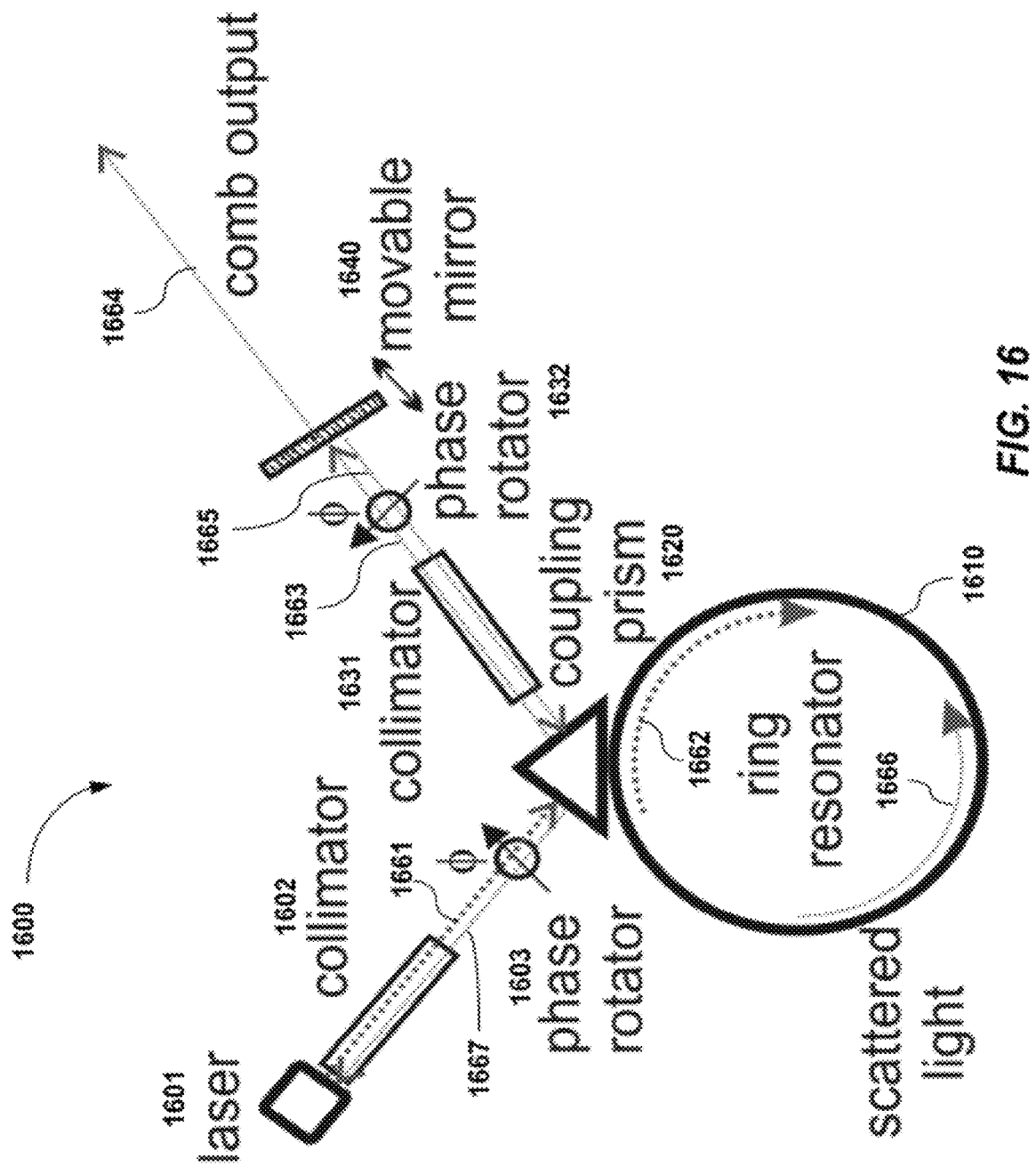
FIG. 16 shows an example for locking a laser to a resonator by using an external reflector.

The second feedback mechanism uses a reflector, e.g., an additional partially transparent mirror, placed at the output optical path of the nonlinear resonator to generate a reflection back to the nonlinear resonator and then to the laser. FIG. 16 shows an example of a device 1600 that locks a laser 1601 to a nonlinear resonator 1610. The nonlinear resonator 1610 can be a ring resonator, a disk resonator, a spherical resonator or non-spherical resonator (e.g., a spheroid resonator). An optical coupler 1620, which can be a coupling prism as shown, is used to provide optical input to the resonator 1610 and to provide optical output from the resonator 1610. The laser 1601 produces and directs a laser beam 1661 to the coupling prism 1620 which couples the laser beam 1661 into the resonator 1610 as the beam 1662 circulating in the counter-clock wise direction inside the resonator 1610. The light of the circulating beam 1662 is optically coupled out by the optical coupler 1620 as a resonator output beam 1663. A reflector 1640 is placed after the coupling prism 1620 in the optical path of the resonator output beam 1663 to reflect at least a portion of the resonator output beam 1663 back to the coupling prism 1620. Optical collimators 1602 and 1631 can be used to collimate the light. The reflector 1640 can be a partial reflector to transmit part of the resonator output beam 1663 as an output beam 1664 and to reflect part of the resonator output beam as a returned beam 1665. The reflector 1640 may also be a full reflector that reflects all light of the beam 1663 back as the returned beam 1665. The feedback beam 1665 is coupled into the resonator 1610 as a counter propagating beam 1666 which is coupled by the coupling prism 1620 as a feedback beam 1667 towards the laser 1601. The feedback beam 1667 enters the laser 1601 and causes the laser to lock to the resonator 1610 via injecting locking.

The above laser locking based on optical feedback from the nonlinear resonator 1610 based on either the Rayleigh scattering inside the resonator 1610 or the external reflector 1640 can be established when the optical phase of the feedback beam 1667 from the resonator 1610 to the laser 1601 meets the phase matching condition for the injection locking. A phase control mechanism can be implemented in the optical path of the feedback beam 1667 in the Rayleigh scattering scheme or one or more beams 1661, 1662, 1663, 1665, 1666 and 1667 in the scheme using the external reflector 1640 to adjust and control the optical phase of the feedback beam 1667. As illustrated, in one implementation of this phase control mechanism, the reflector 1540 may be a movable mirror that can be controlled to change its position along the optical path of the beam 1663 to adjust the optical phase of the feedback beam 1667. The phase of the returning signal 1667 can also be adjusted either by a phase rotator 1603 placed between the laser 1601 and the coupler 1620 or a phase rotator 1663 placed between the coupler 1620 or collimator 1631 and the external reflector or mirror 1640. A joint configuration of using both the Rayleigh scattering inside the resonator 1610 and the external reflector 1640 may also be used. The selection of the configuration depends on the operating conditions including the loading of the resonator 1610 with the coupler 1620 as well as the strength of the Rayleigh scattering in the resonator 1610. Such a locking technique can be used allow avoiding technical difficulties associated with using the PDH locking and other locking designs.

Referring back to the triple oscillator device in FIG. 1, the above described features in optical comb generation can be used in implementing triple oscillator devices in various configurations.

Figure 17:
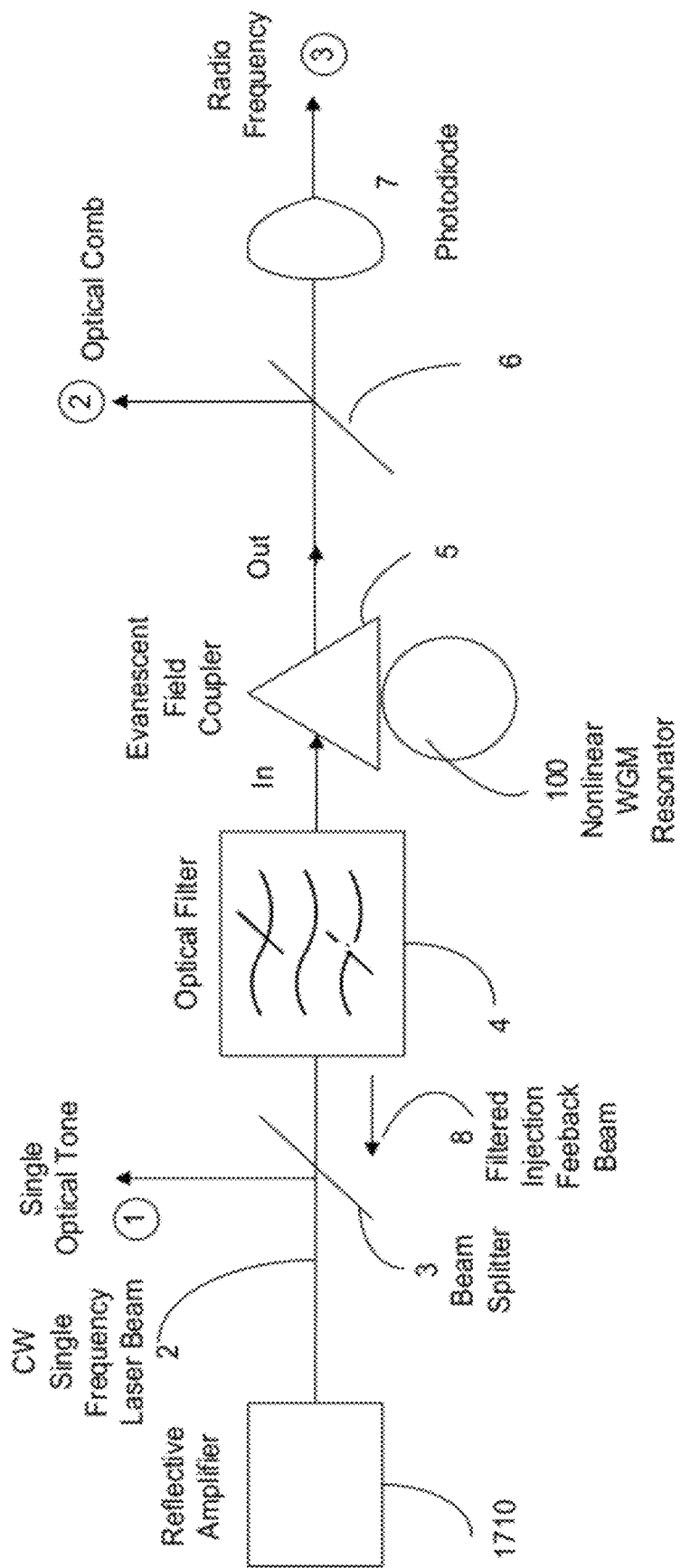
FIGS. 17, 18, 19 and 20 show additional design examples of triple-oscillator devices.

FIG. 17 shows another example of a triple-oscillator device for generating a single optical tone, a radio frequency (RF) oscillation signal and an optical comb signal having different optical frequencies. In this example, a reflective optical amplifier 1710 is used to replace the laser 1 in FIG. 1. This reflective amplifier 1710 can be, for example, a semiconductor amplifier that is energized by an electrical current to produce the desired optical gain for amplifying light. The amplifier 1710 reflects light and amplifies light from the resonator 100 to direct reflected light towards the resonator 100 to interact with the nonlinear optical material of the resonator 100 to generate the optical comb having different optical frequencies inside the resonator 100. The optical coupler 5 performs two optical coupling functions: (1) coupling light inside the resonator 100 out of the resonator 100 as a feedback beam 8 towards the reflective amplifier 1710, and (2) coupling light from the reflective amplifier 1710 into the resonator 100. The bandpass filter 4 that transmit light at the laser carrier frequency while blocking other optical spectral components is located between the reflective amplifier 1710 and the optical coupler 5 to ensure the device in FIG. 17 is operated at light of the laser carrier frequency in the optical part between the reflective amplifier 1710 and the resonator 100. The optical gain provided by the reflective amplifier 1710 is sufficient to establish laser oscillation between the reflective amplifier 1710 and the resonator 100 at the laser carrier frequency based on the optical feedback from the reflection of the reflective amplifier 1710 and the feedback beam produced by the optical coupler 5.

Figure 18:
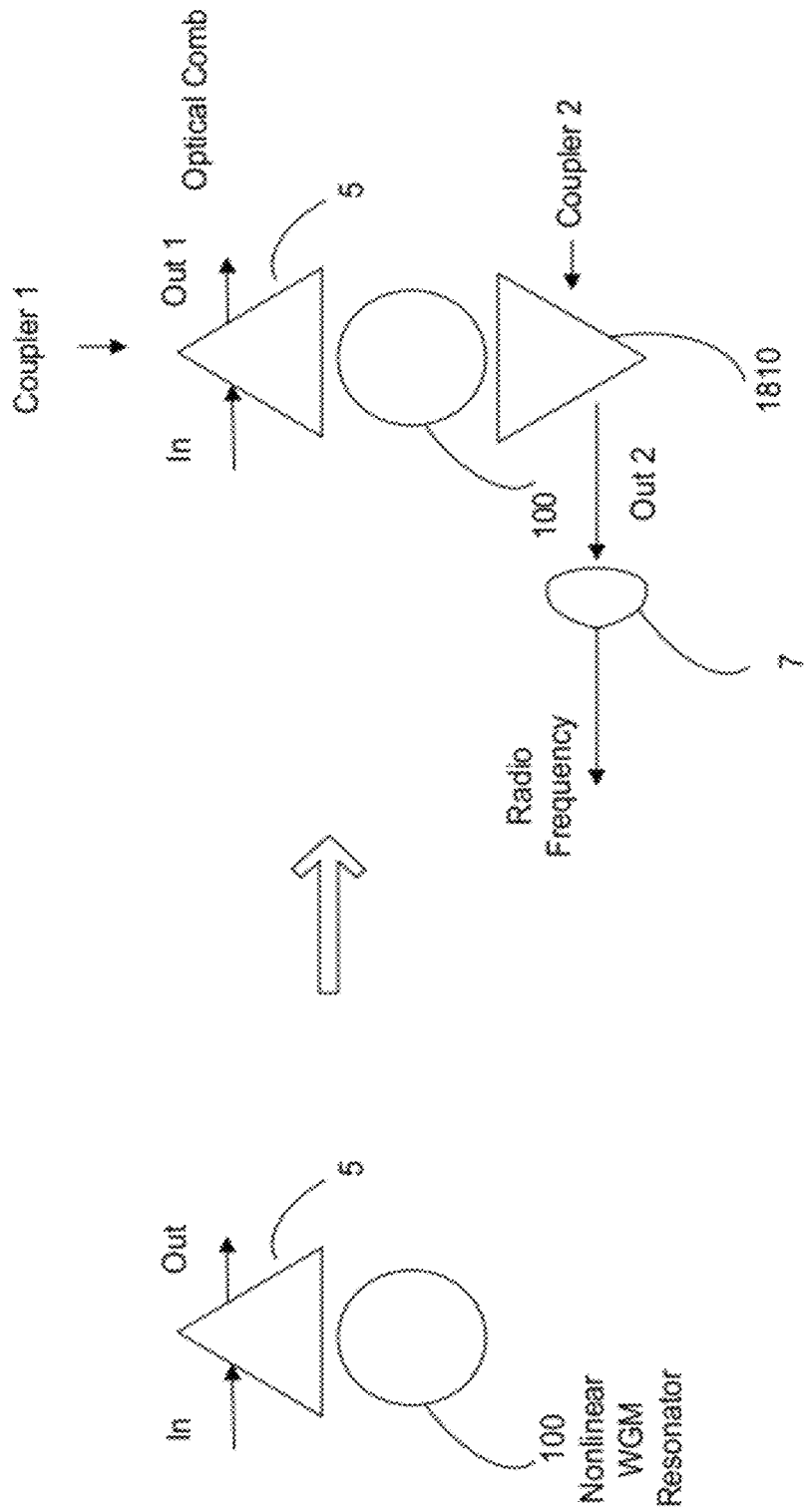

FIG. 18 shows that the design based on a single coupler 5 in FIGS. 1 and 17 can be replaced by using two separate couplers 5 and 1810. In this example, the first coupler 5 is used to perform (1) coupling light from the laser 1 or the reflective amplifier 1710 into the resonator 100, (2) coupling light inside the resonator 100 out to produce the injection feedback beam towards the laser 1 or the reflective amplifier 1710, and (3) coupling light inside the resonator 100 out to produce the output optical beam with the optical comb. The second coupler 1810 is used to coupling light inside the resonator 100 out to be received by the photodiode 7 for generating the RF or microwave oscillation signal. The second coupler 1810 can be implemented in various configurations, including but not limited to, evanescent optical couplers in some implementations.

Figure 19:
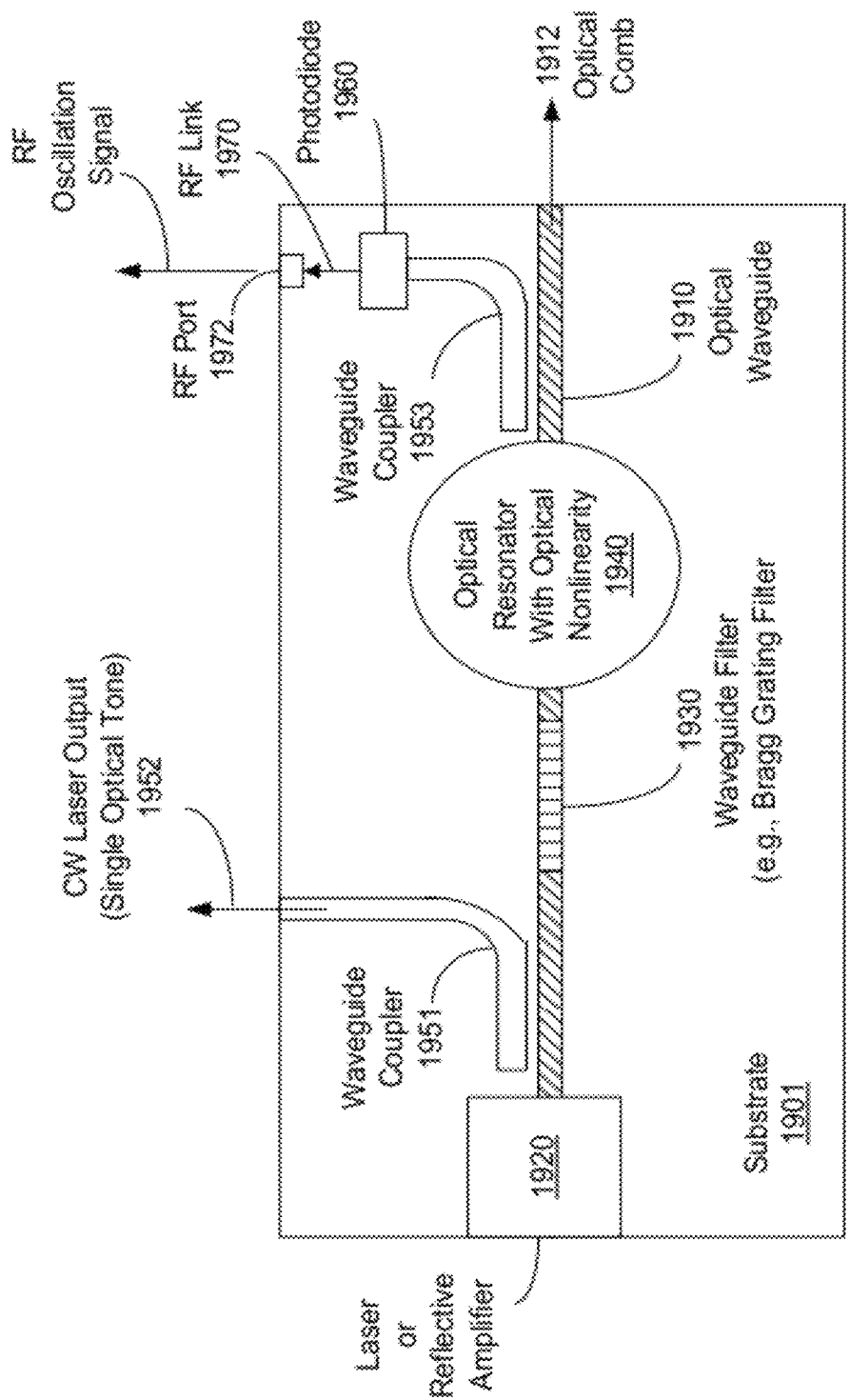

FIG. 19 shows an example of a triple oscillator device on a substrate in a chip package. A substrate 1901 is provided and fabricated to include or support an optical waveguide 1910. The substrate 1901 can be a planar dielectric substrate made of a suitable material such as a semiconductor material, a glass material and others. A resonator 1940, e.g., a nonlinear WGM resonator, is optically coupled to the waveguide 1910 and is placed on the substrate 1901. A laser or reflective semiconductor amplifier 1920 is formed on one end of the waveguide 1910 to direct light into and to receive light from the waveguide 1910. The optical coupling between the optical resonator 1940 and the optical waveguide 1910 allows light in the waveguide 1910 from the laser or amplifier 1920 to be coupled into the optical resonator 1940 and also allows light confined inside the optical resonator 1940 to be coupled out into the optical waveguide 1910 towards the laser or amplifier 1920. A waveguide filter 1930, e.g., a Bragg grating filter, is formed inside the waveguide 1910 to perform the filtering function of the optical filter 4 shown in FIGS. 1 and 17 to transmit one selective optical tone in the optical comb generated inside the resonator 1940 while blocking other optical tones in the optical comb. The optical frequency comb generated inside the optical resonator 1940 is coupled into the optical waveguide 1910 as the optical frequency comb output 1912.

In FIG. 19, a first optical waveguide coupler 1951 is provided to couple to the optical waveguide 1910, e.g., optical evanescent coupling or optical grating-based coupling, at a location between the laser or amplifier 1920 and the waveguide filter 1930 to couple light inside that section of the waveguide 1910 out as a CW laser output 1952 (the single optical tone output). A second optical waveguide coupler 1953 is provided at a location of the optical waveguide 1910 where the light in the waveguide 1910 has the optical frequency comb generated inside the optical resonator 1940, e.g., at a location in the optical waveguide 1910 on the other side the resonator 1940 as shown in FIG. 19. This second waveguide coupler 1953 couples light inside that section of the waveguide 1910 out to direct the coupled optical frequency comb signal to a photodiode 1960 formed on the substrate 1901. The output of the photodiode 1960 is the RF oscillation signal. An RF link 1970 is formed on the substrate 1901 to guide the RF oscillation signal to an RF port 1972.

Figure 20:
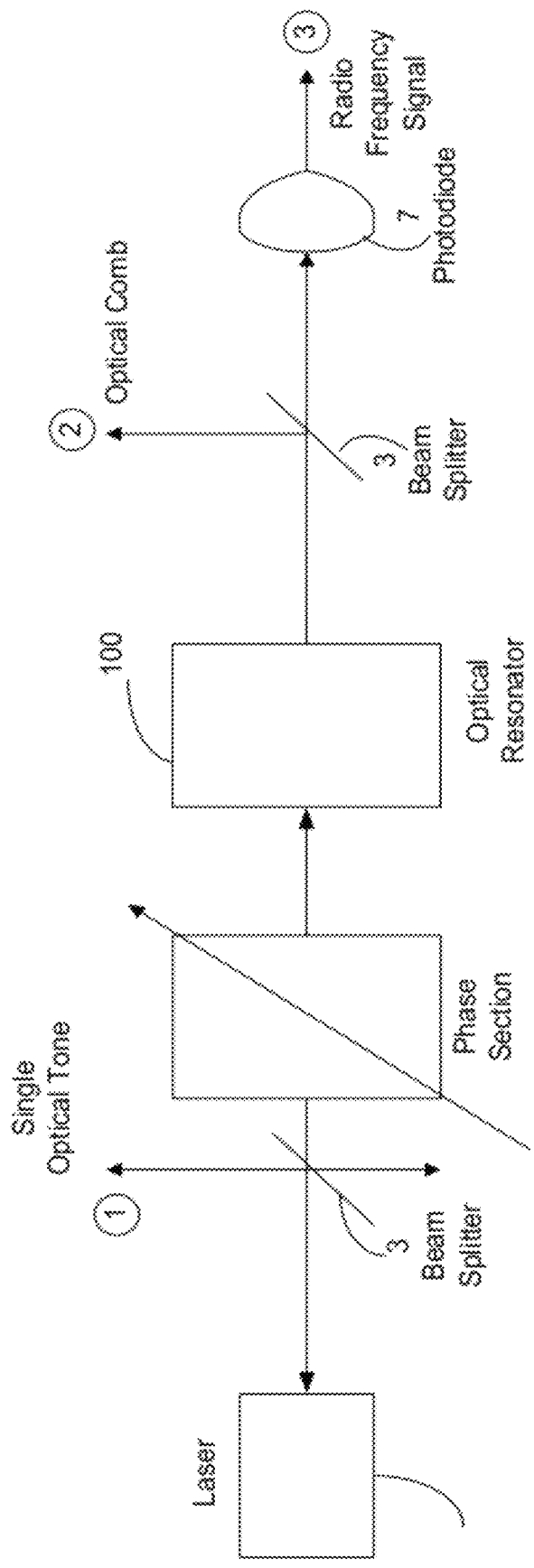

Referring to FIG. 20, a phase control mechanism is provided in a triple oscillator device based on the design in FIG.

1. In this example, the phase control mechanism is implemented as a phase control section located between the laser 1 and the resonator 100 and configured to control a phase of the light between the laser 1 and the resonator 100 to stabilize the device. This phase control also modifies the frequency detuning between the laser carrier frequency and the corresponding resonator mode of the resonator 100 with respect to which the laser 1 is injection locked.

In other implementations where the laser 1 is replaced by a reflective amplifier that sustains a laser oscillation with based on optical feedback from the optical resonator, the phase control section is provided to produce stable laser oscillation and to tune the frequency difference between the emitted laser light and the resonator mode producing the optical feedback for the reflective amplifier.

Various designs for the phase section can be implemented. For example, the phase control section can include a thermal heater that changes a temperature of the phase section material to control, e.g., the refractive index or thermal expansion, of the phase section material and to control the phase of the light between the laser 1 and the resonator 100. This thermal phase control can be based on one of or a combination of thermo-refractive and thermal expansion effects in the phase control section. For another example, the phase control section can include a piezo-electric element that changes the phase of the light between the laser 1 and the resonator 100 in response to an applied electrical voltage signal. For another example, the phase control section can include a semiconductor phase shifter that changes the phase of the light between the laser 1 and the resonator 100. In yet another example, the phase control section is configured to produce an adjustable delay that changes the phase of the light between the laser 1 and the resonator 100.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A triple-oscillator device for generating a single optical tone, a radio frequency (RF) oscillation signal and an optical frequency comb signal having different optical frequencies, comprising:

an optical resonator formed of a nonlinear optical material exhibiting a third order optical nonlinearity;

laser to produce a continuous wave (CW) laser beam at a laser carrier frequency that interacts with the nonlinear optical material of the optical resonator to generate the optical frequency comb having different optical frequencies including the laser carrier frequency inside the optical resonator;

an optical coupler that couples the laser beam into the optical resonator and light inside the optical resonator out of the optical resonator as a self-injection feedback beam towards the laser;

an optical filter located between the laser and the optical resonator to filter the self-injection feedback beam directed from the optical coupler to the laser to direct light at the laser carrier frequency into the laser to cause injection locking of the laser to the optical resonator at the laser carrier frequency while blocking other spectral components in the self-injection feedback beam from entering the laser;

a first beam splitter placed between the laser and the optical filter to transmit a portion of the light between the laser and the optical filter and to direct another portion of the light as a first device output which is a single optical tone at the laser carrier frequency;

a photodiode located to receive an output optical beam coupled out of the optical resonator carrying the optical frequency comb to produce an RF oscillation signal as a second device output; and a second beam splitter located in an optical path of the output optical beam received by the photodiode to transmit a portion of the output optical beam to the photodiode for generating the RF oscillation signal and to direct another portion of the output optical beam as a third device output which is a replica of the optical frequency comb generated inside the optical resonator.

2. The device as in claim 1, wherein the laser is a semiconductor laser.

3. The device as in claim 1, comprising:

a substrate on which the optical resonator is located; and an optical waveguide formed on the substrate that carries the laser beam from the laser to the optical resonator and to carry the output optical beam from the optical resonator having the optical comb.

4. The device as in claim 1, comprising:

a phase control section located between the laser and the optical resonator and configured to control a phase of the light between the laser and the optical resonator to stabilize the device and control a frequency detuning between the laser carrier frequency and a resonator mode of the optical resonator with respect to which the laser is injection locked.

5. The device as in claim 4, wherein the phase control section includes a thermal heater that changes a temperature of the phase control section to control the phase of the light between the laser and the optical resonator.

6. The device as in claim 4, wherein the phase control section includes a piezo-electric element that changes the phase of the light between the laser and the optical resonator.

7. The device as in claim 4, wherein the phase control section includes a semiconductor phase shifter that changes the phase of the light between the laser and the optical resonator.

8. The device as in claim 4, wherein the phase control section is configured to produce an adjustable delay that changes the phase of the light between the laser and the optical resonator.

9. The device as in claim 1, wherein the optical coupler is used to couple both the laser beam from the laser into the optical resonator and to couple light inside the optical resonator out as the output optical beam to the photodiode.

10. The device as in claim 1, comprising:

a second optical coupler optically coupled to the optical resonator to couple light inside the optical resonator out as the output optical beam to the photodiode.

11. The device as in claim 1, wherein:
- the optical resonator is a whispering-gallery-mode resonator that supports whispering gallery modes, and
- the optical coupler is an optical evanescent coupler.

12. A triple-oscillator device for generating a single optical tone, a radio frequency (RF) oscillation signal and an optical frequency comb signal having different optical frequencies, comprising:
- an optical resonator formed of a nonlinear optical material exhibiting a third order optical nonlinearity;
- a reflective amplifier that reflects light and amplifies light from the optical resonator to direct reflected light towards the optical resonator to interact with the nonlinear optical material of the optical resonator to generate the optical frequency comb having different optical frequencies inside the optical resonator, the reflective amplifier providing an optical gain to sustain laser oscillation between the reflective amplifier and the optical resonator at a laser carrier frequency;
- an optical coupler that couples the light from the reflective amplifier into the optical resonator and light inside the optical resonator out of the optical resonator as a feedback beam towards the reflective amplifier and further couples light from the reflective amplifier into the optical resonator;
- an optical filter located between the reflective amplifier and the optical resonator to filter the feedback beam directed from the optical coupler to the reflective amplifier to direct light at the laser carrier frequency within the feedback beam into the reflective amplifier to cause amplification of the light at the laser carrier frequency;
- a first beam splitter placed between the reflective amplifier and the optical filter to transmit a portion of the light between the reflective amplifier and the optical filter and to direct another portion of the light as a first device output which is a single optical tone at the laser carrier frequency;
- a photodiode located to receive an output optical beam coupled out of the optical resonator carrying the optical frequency comb to produce an RF oscillation signal as a second device output; and
- a second beam splitter located in an optical path of the output optical beam received by the photodiode to transmit a portion of the output optical beam to the photodiode for generating the RF oscillation signal and to direct another portion of the output optical beam as a third device output which is a replica of the optical frequency comb generated inside the optical resonator.

13. The device as in claim 12, comprising:
- a substrate on which the optical resonator is located; and
- an optical waveguide formed on the substrate that carries the light from the reflective amplifier to the optical resonator and to carry the output optical beam from the optical resonator having the optical frequency comb.

14. The device as in claim 12, comprising:
- a phase control section located between the reflective amplifier and the optical resonator and configured to control a phase of the light between the reflective amplifier and the optical resonator.

15. The device as in claim 14, wherein the phase control section includes a thermal heater that changes a temperature of the phase control section to control the phase of the light between the reflective amplifier and the optical resonator.

16. The device as in claim 14, wherein the phase control section includes a piezo-electric element that changes the phase of the light between the reflective amplifier and the optical resonator.

17. The device as in claim 14, wherein the phase control section includes a semiconductor phase shifter that changes the phase of the light between the reflective amplifier and the optical resonator.

18. The device as in claim 14, wherein the phase control section is configured to produce an adjustable delay that changes the phase of the light between the reflective amplifier and the optical resonator.

19. The device as in claim 12, wherein the optical coupler is used to couple both the light from the reflective amplifier into the optical resonator and to couple light inside the optical resonator out as the output optical beam to the photodiode.

20. The device as in claim 12, comprising:
- a second optical coupler optically coupled to the optical resonator to couple light inside the optical resonator out as the output optical beam to the photodiode.

21. The device as in claim 12, wherein:
- the optical resonator is a whispering-gallery-mode resonator that supports whispering gallery modes, and
- the optical coupler is an optical evanescent coupler.

22. A triple-oscillator device for generating a single optical tone, a radio frequency (RF) oscillation signal and an optical frequency comb signal having different optical frequencies, comprising:
- an optical resonator formed of a nonlinear optical material exhibiting a third order optical nonlinearity;
- a laser to produce a continuous wave (CW) laser beam at a laser carrier frequency that interacts with the nonlinear optical material of the optical resonator to generate the optical frequency comb having different optical frequencies including the laser carrier frequency inside the optical resonator;
- an optical coupler that couples the laser beam into the optical resonator and light inside the optical resonator out of the optical resonator as a self-injection feedback beam towards the laser;
- an optical filter located between the laser and the optical resonator to filter the self-injection feedback beam directed from the optical coupler to the laser to direct light at the laser carrier frequency into the laser to cause injection locking of the laser to the optical resonator at the laser carrier frequency while blocking other spectral components in the self-injection feedback beam from entering the laser;
- means for transmitting a portion of the light between the laser and the optical filter and for directing another portion of the light as a first device output which is a single optical tone at the laser carrier frequency;
- a photodiode located to receive an output optical beam coupled out of the optical resonator carrying the optical frequency comb to produce an RF oscillation signal as a second device output; and
- means for splitting the output optical beam towards the photodiode into (1) a first portion of the output optical beam to reach the photodiode which generates the RF oscillation signal from the first portion and (2) a second portion of the output optical beam as a third device output which is a replica of the optical frequency comb generated inside the optical resonator.

23. The device as in claim 22, wherein the laser is a semiconductor laser.

24. The device as in claim 22, comprising:
- a substrate on which the resonator is located; and
- an optical waveguide formed on the substrate that carries the laser beam from the laser to the optical resonator and to carry the output optical beam from the optical resonator having the optical comb.

25. The device as in claim 22, comprising:
a phase control section located between the laser and the optical resonator and configured to control a phase of the light between the laser and the optical resonator to stabilize the device and control a frequency detuning between the laser carrier frequency and a resonator mode of the optical resonator with respect to which the laser is injection locked.

26. A triple-oscillator device for generating a single optical tone, a radio frequency (RF) oscillation signal and an optical frequency comb signal having different optical frequencies, comprising:
an optical resonator formed of a nonlinear optical material exhibiting a third order optical nonlinearity;
a reflective amplifier that reflects light and amplifies light from the optical resonator to direct reflected light towards the optical resonator to interact with the nonlinear optical material of the optical resonator to generate the optical frequency comb having different optical frequencies inside the optical resonator, the reflective amplifier providing an optical gain to sustain laser oscillation between the reflective amplifier and the optical resonator at a laser carrier frequency;
means for coupling the light from the reflective amplifier into the optical resonator and light inside the optical resonator out of the optical resonator as a feedback beam towards the reflective amplifier and for coupling light from the reflective amplifier into the optical resonator;
an optical filter located between the reflective amplifier and the optical resonator to filter the feedback beam to the reflective amplifier and to direct light at the laser carrier frequency within the feedback beam into the reflective amplifier to cause amplification of the light at the laser carrier frequency;
means for transmitting a portion of the light between the reflective amplifier and the optical filter and for directing another portion of the light as a first device output which is a single optical tone at the laser carrier frequency;
a photodiode located to receive an output optical beam coupled out of the optical resonator carrying the optical frequency comb to produce an RF oscillation signal as a second device output; and
means for transmitting a first portion of the output optical beam towards the photodiode which generates the RF oscillation signal from the first portion and for directing a second portion of the output optical beam as a third device output which is a replica of the optical frequency comb generated inside the optical resonator.

27. The device as in claim 26, comprising:
a substrate on which the optical resonator is located; and
an optical waveguide formed on the substrate that carries the light from the reflective amplifier to the optical resonator and to carry the output optical beam from the optical resonator having the optical frequency comb.

28. The device as in claim 26, comprising:
a phase control section located between the reflective amplifier and the optical resonator and configured to control a phase of the light between the reflective amplifier and the optical resonator.

\* \* \* \* \*